(12) United States Patent
Bettencourt et al.

(10) Patent No.: US 7,226,055 B1
(45) Date of Patent: Jun. 5, 2007

(54) SUBSTRATE HOLDING AND SPINNING ASSEMBLY AND METHODS FOR MAKING THE SAME

(75) Inventors: Gregory R. Bettencourt, Fremont, CA (US); Anthony de la Llera, Fremont, CA (US); Xuyen N. Pham, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 665 days.

(21) Appl. No.: 10/611,227

(22) Filed: Jun. 30, 2003

Related U.S. Application Data

(60) Provisional application No. 60/474,984, filed on May 30, 2003.

(51) Int. Cl.
*B23B 31/18* (2006.01)
(52) U.S. Cl. .................. 279/106; 118/503; 118/730; 134/149; 134/153; 134/902
(58) Field of Classification Search ............. 279/35, 279/37, 39, 40, 106, 107, 109, 114; 118/500, 118/503, 730; 134/149, 153, 902
See application file for complete search history.

(56) References Cited

U.S. PATENT DOCUMENTS

| | | | | |
|---|---|---|---|---|
| 2,207,621 A | * | 7/1940 | Hite ............................ | 279/110 |
| 2,667,356 A | * | 1/1954 | Foward ....................... | 279/4.1 |
| 3,933,347 A | * | 1/1976 | Stoffels ........................ | 269/31 |
| 5,421,056 A | * | 6/1995 | Tateyama et al. ............. | 15/302 |
| 6,578,853 B1 | * | 6/2003 | Treur et al. .................. | 279/121 |
| 6,761,362 B2 | * | 7/2004 | Noguchi ....................... | 279/106 |
| 6,827,092 B1 | * | 12/2004 | Smith et al. ................ | 134/149 |
| 6,916,026 B2 | * | 7/2005 | Meza .......................... | 279/110 |
| 7,087,122 B2 | * | 8/2006 | Smith et al. .................. | 134/33 |

* cited by examiner

*Primary Examiner*—Daniel W. Howell
(74) *Attorney, Agent, or Firm*—Martine Penilla & Gencarella, LLP

(57) ABSTRACT

A substrate holding apparatus is provided. The substrate holding apparatus includes a chuck yoke, a plurality of arm assemblies, and a plurality of gripper assemblies. A first end of each of the arm assemblies is connected to the chuck yoke and each of the arm assemblies has a spring. A second end of each of the arm assemblies is connected to a respective one of the plurality of grippers. The chuck yoke is capable of rotating so as to move each of the plurality of arm assemblies and respective plurality of gripper assemblies into either a closed position or an open position. A compression force from each of the springs is applied to a substrate when the grippers are moved to the closed position.

12 Claims, 29 Drawing Sheets

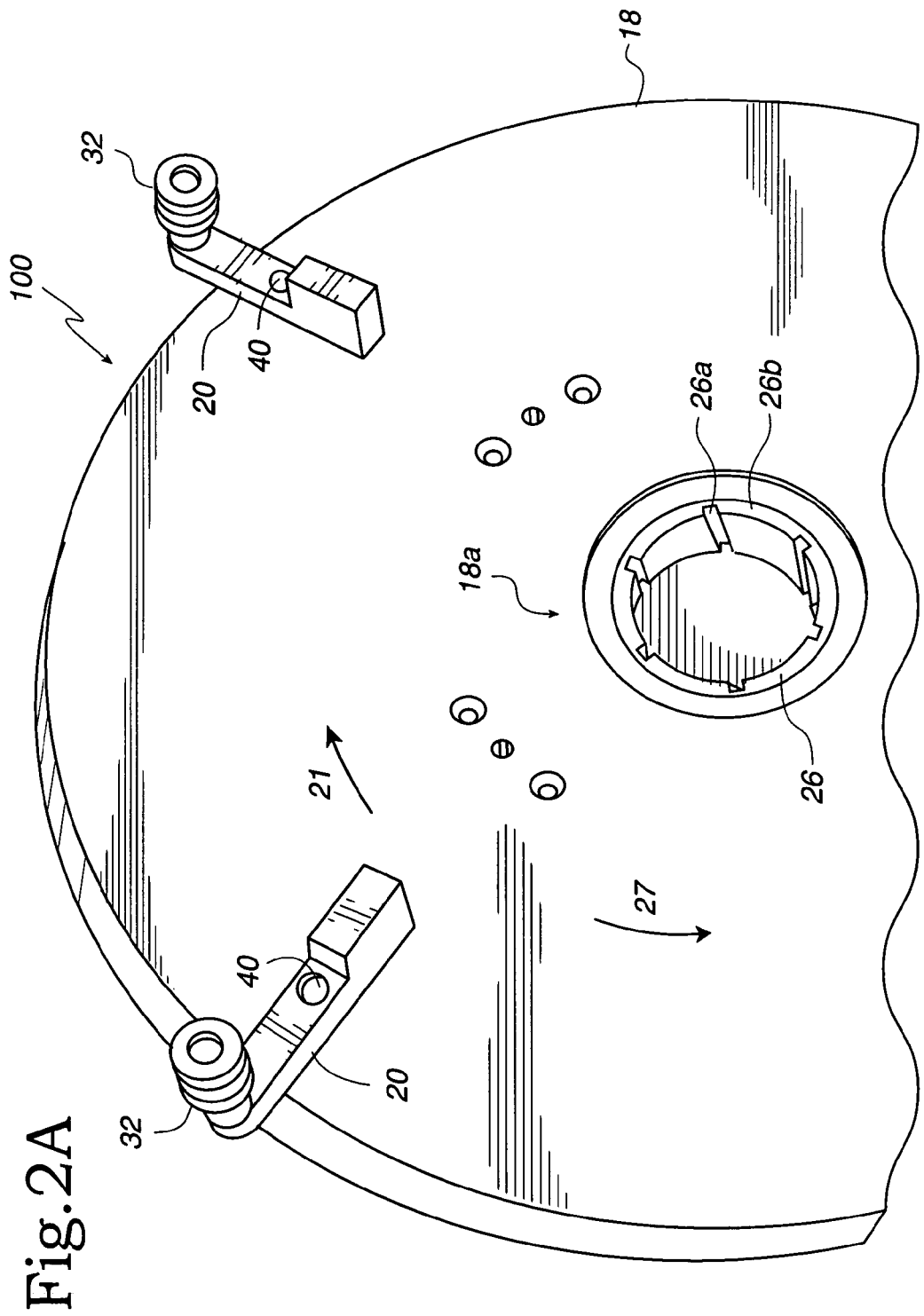

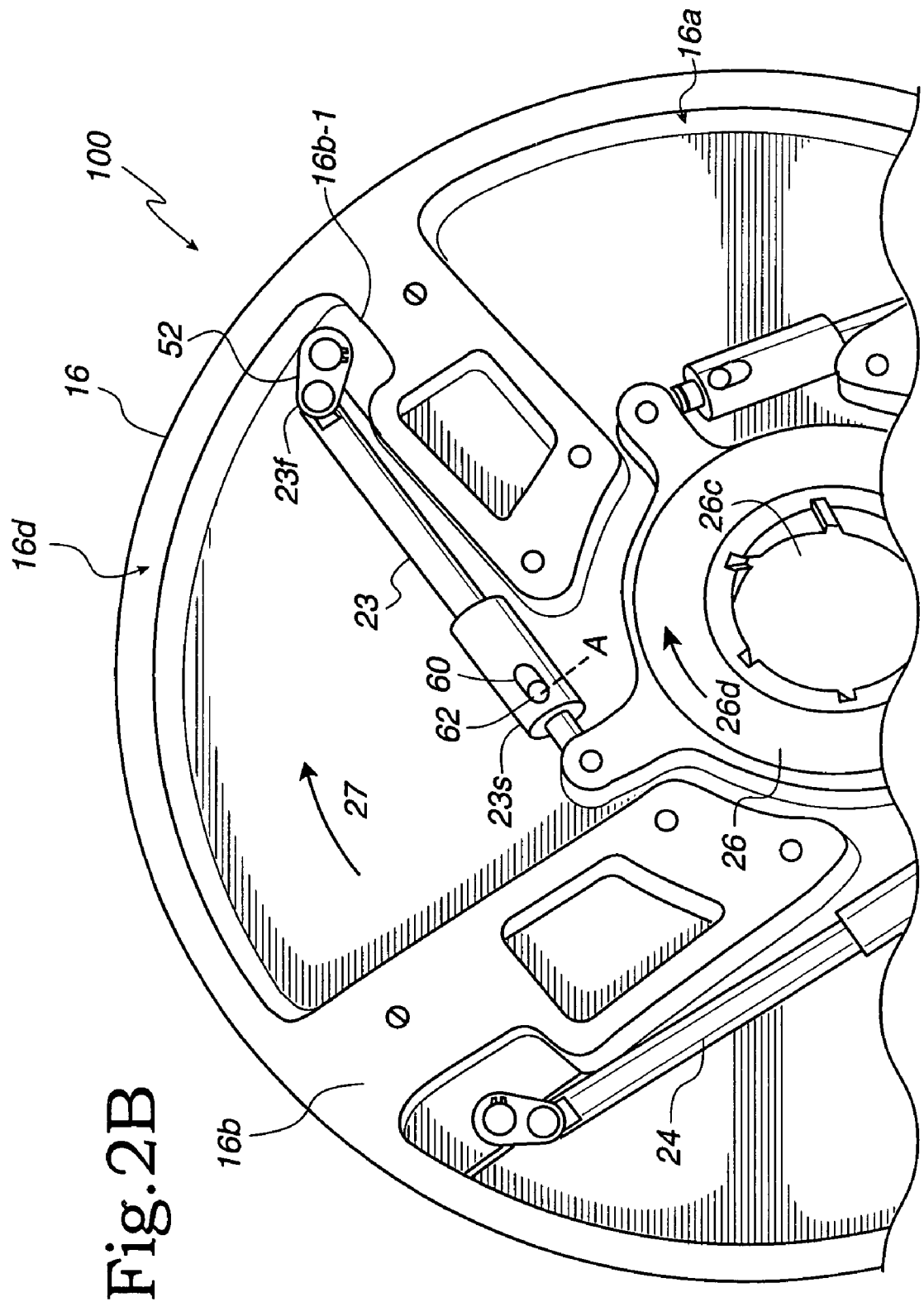

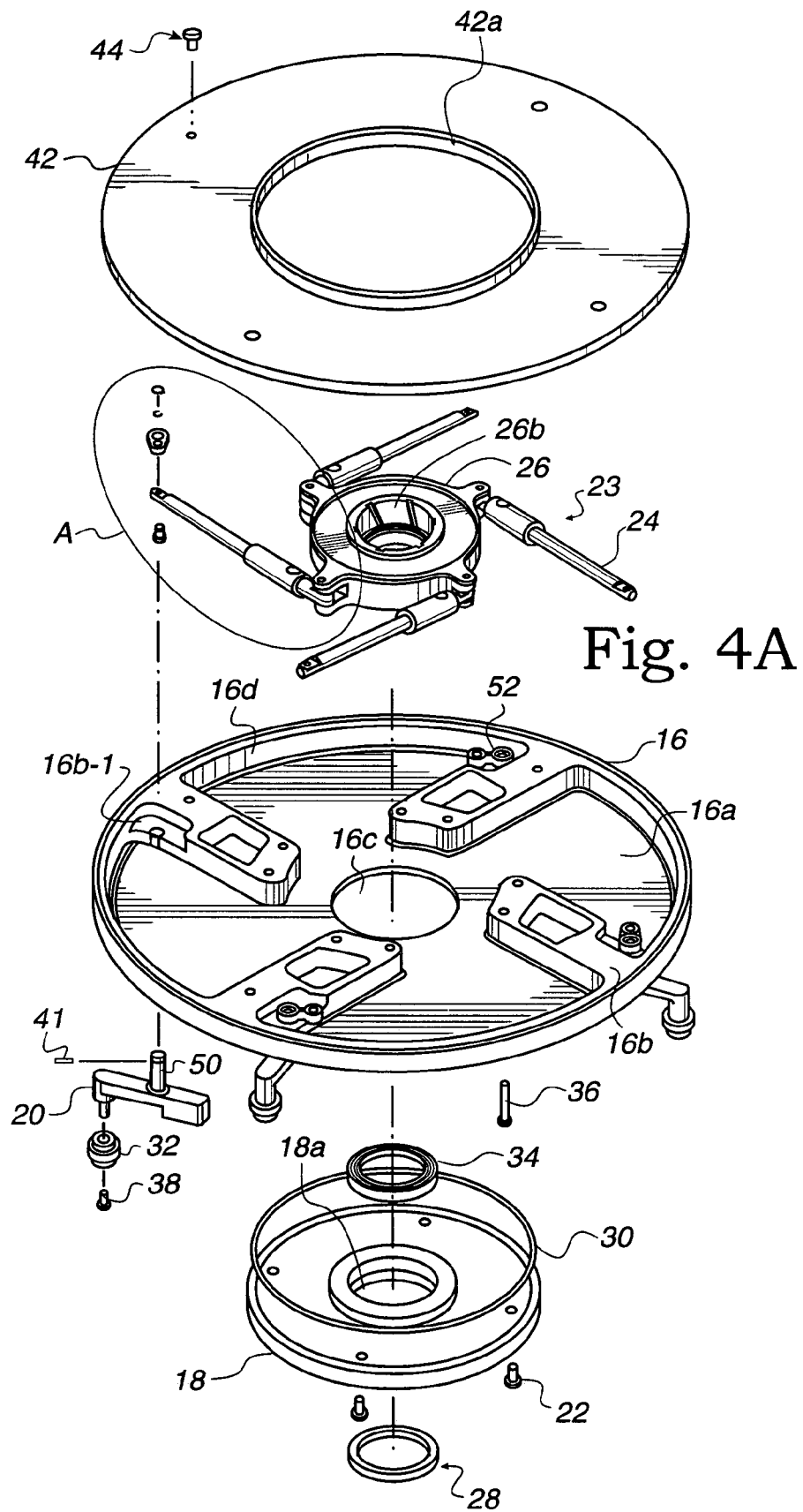

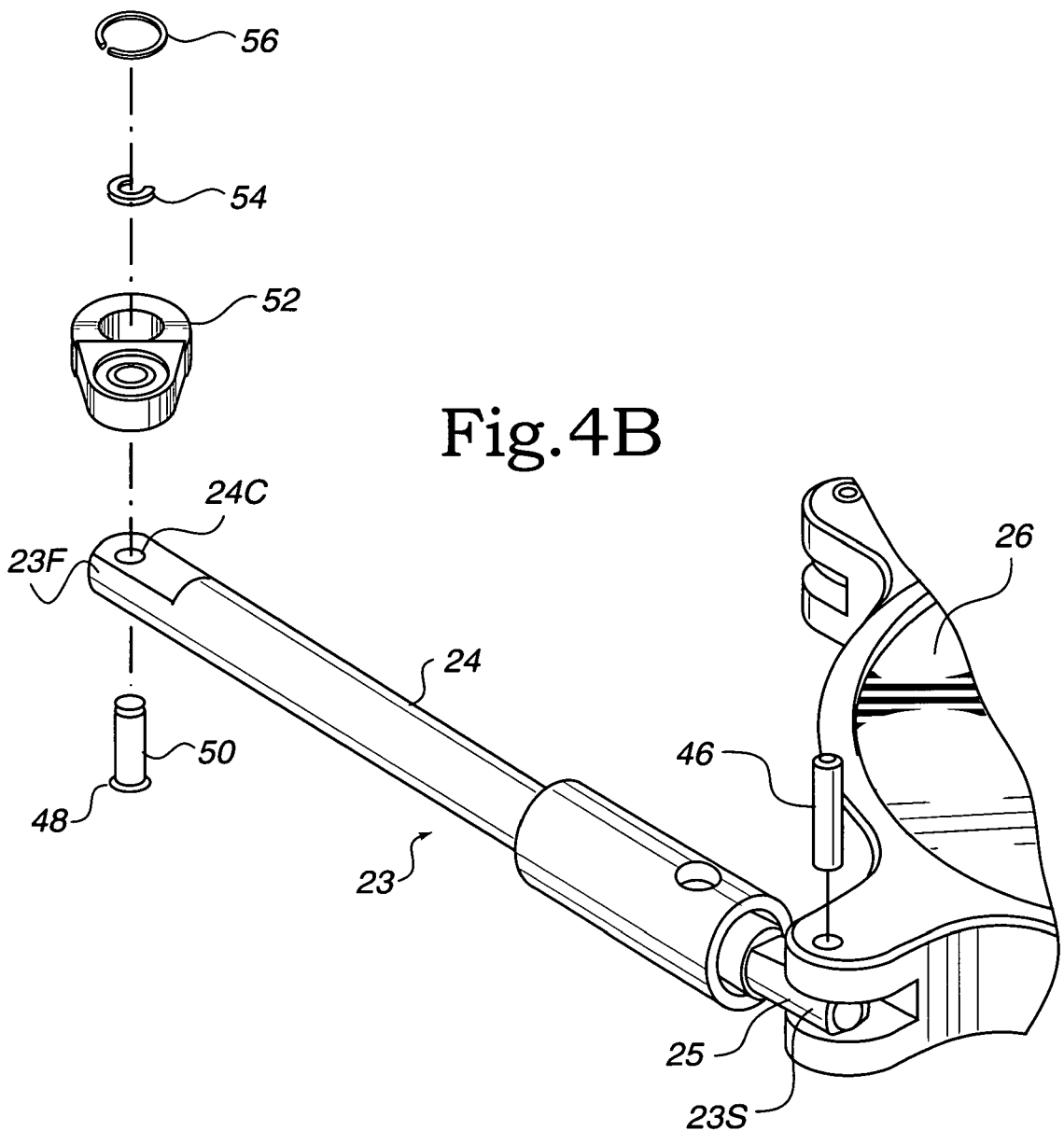

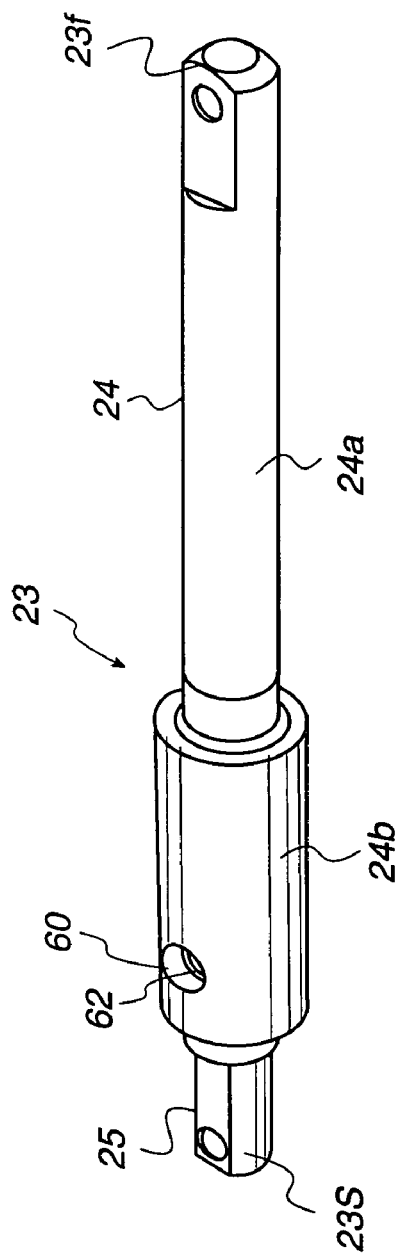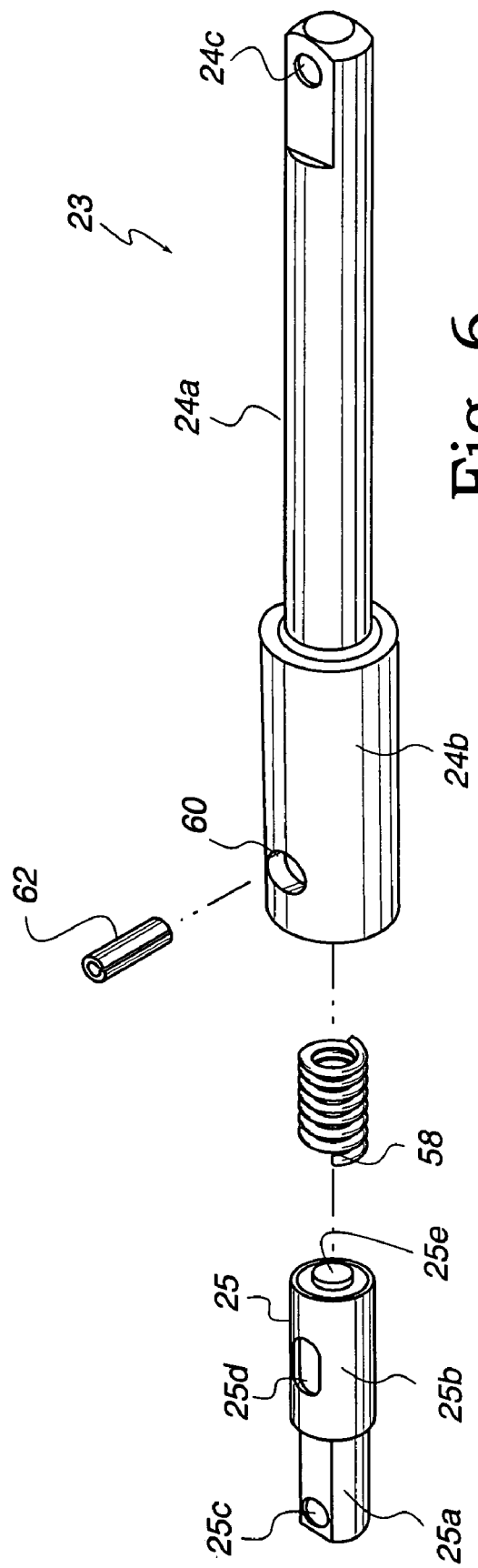

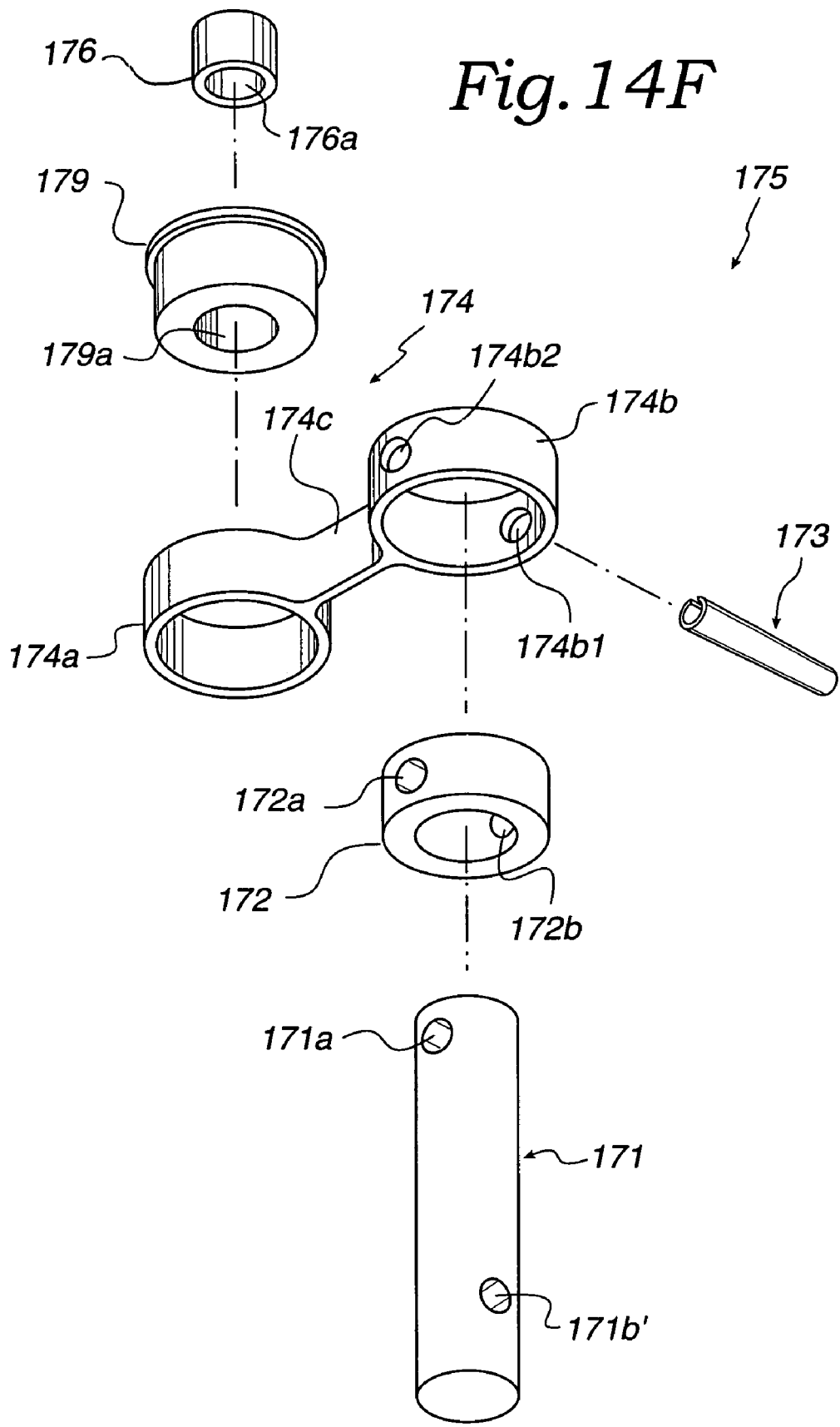

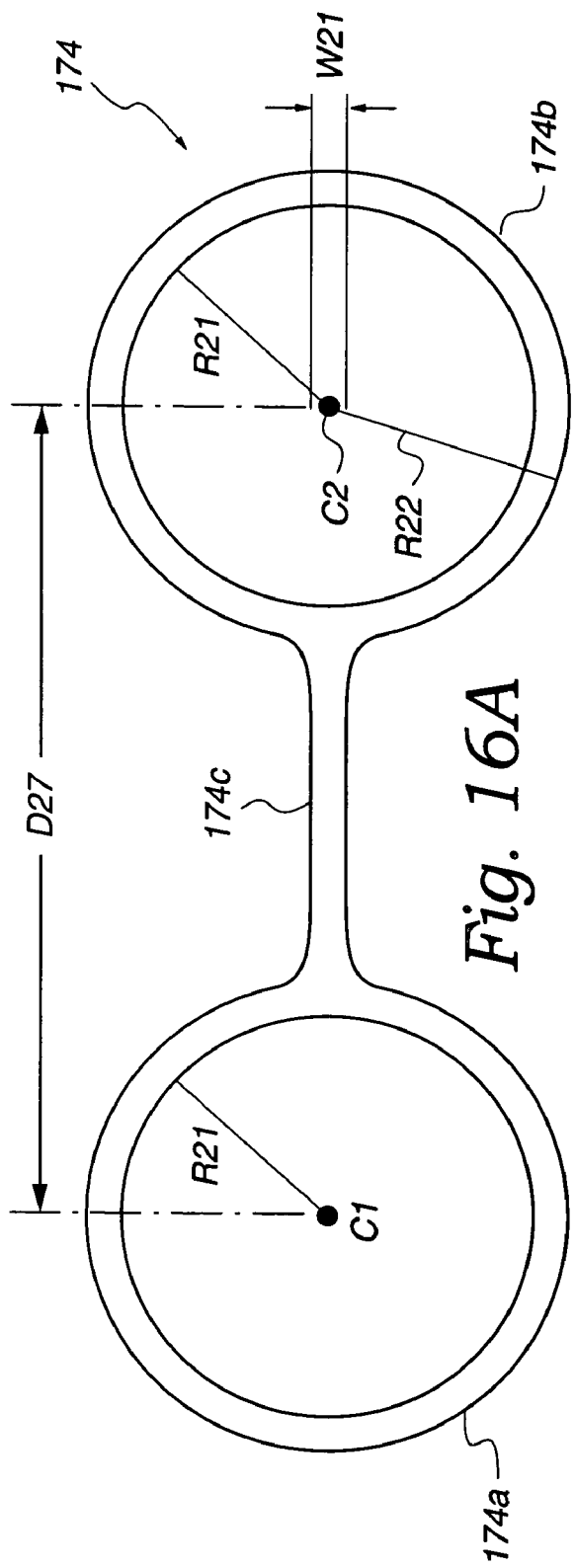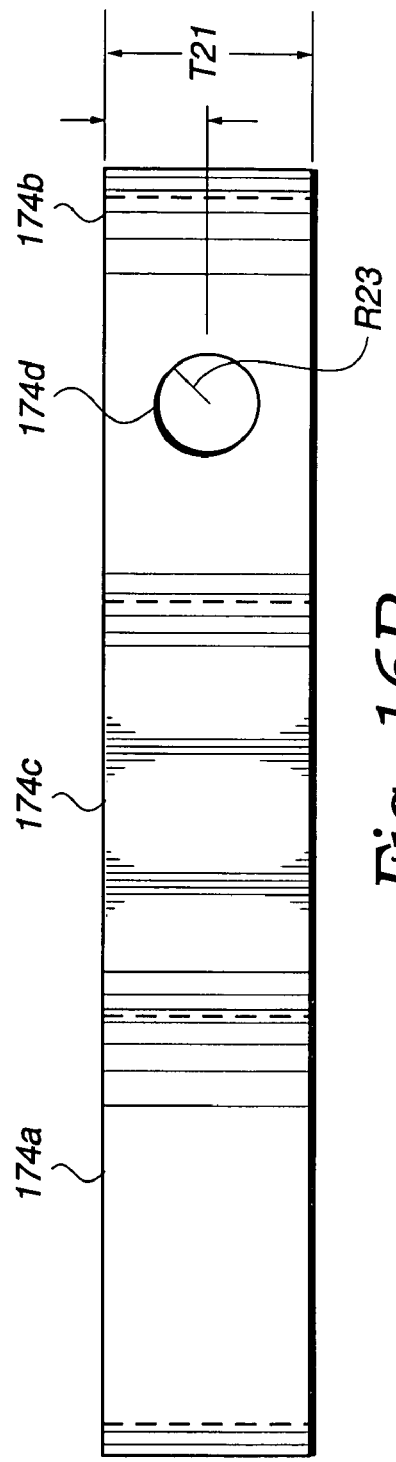

SUBSTRATE HOLDING AND SPINNING ASSEMBLY AND METHODS FOR MAKING THE SAME

CROSS REFERENCE TO RELATED APPLICATIONS

This application claims priority from U.S. Provisional Patent Application No. 60/474,984, filed on May 30, 2003 and entitled "SUBSTRATE HOLDING AND SPINNING ASSEMBLY AND METHODS FOR MAKING SAME" by de la Llera et al., which is incorporated herein by reference in its entirety.

BACKGROUND OF THE INVENTION

1. Field of the Invention

The present invention relates generally to semiconductor wafer preparation and, more particularly, to a chuck assembly for use in semiconductor substrate spin, rinse, and dry (SRD) modules.

2. Description of the Related Art

Wafer preparation and cleaning operations are performed in the fabrication of semiconductor devices. One common wafer preparation operation dispersedly repeated during substrate preparation is a spin, rinse, and dry operation using a spin, rinse, and dry (SRD) module. Usually, spin, rinse, and dry operations are performed in a process bowl mounted on an SRD housing that is secured to a spindle. Typically, the spindle, a chuck mounted on the spindle, and the wafer held by spindle fingers attached to the chuck are rotated by a motor.

Several limitations are associated with conventional SRD modules. At the outset, the design of conventional SRD chucks is very complex. For instance, the chuck is commonly required to move up and down in the bowl. That is, the chuck typically moves up to receive the wafer, moves down to process the wafer and then up again to hand off the process wafer. In view of this continued movement activity, the chuck must remain properly calibrated so that the chuck comes to rest at the exact process level. Failure to maintain the chuck properly calibrated results in mandatory realignment of the chuck. Of course, the process of realigning the chuck is very time consuming and labor intensive, and requires that the SRD modules be taken off-line for an extended period of time, substantially reducing throughput.

Another limitation associated with conventional SRD chucks is the chuck geometry. The relatively large size and substantial weight of conventional chucks require the use of a significant amount of energy to operate the SRD modules. Additionally, the significantly large size of the chucks requires using larger shafts as well as spindles. Collectively, these limitations mandate using of a larger and more powerful pneumatic control, substantially increasing the cost of the SRD modules as well as the associated operating cost.

The rather large geometry of conventional chucks further hinders the removal and replacement of chucks and spindles for maintenance. For instance, removing and replacing of chucks and spindles are typically very time consuming tasks requiring that the entire chuck and spindle assemblies to be removed, which can take up to several hours. This may have substantial negative effects on the overall throughput of the SRD module, as the SRD module is taken off-line when the chuck assembly or the spindle assembly is maintained.

Still another limitation associated with conventional SRD chucks is fluctuations in air pressure implemented to engage/disengage the process wafer. The air pressure is typically supplied by an air cylinder that drives the shaft, which opens and closes the chuck for engaging/disengaging the process wafer. In conventional SRD modules, air pressure causes the chuck to open, close, or maintain a grip on the wafer during processing. Unfortunately, conventional chucks may not always securely engage the process wafer throughout the spin, rinse, and dry cycle due to fluctuations in supplied air pressure. As a result, the spindle fingers and thus the chuck can potentially lose contact with the wafer edge while the wafer rotates at high RPMs, causing the process wafer to potentially fly off. As can be appreciated, failure to apply consistent and constant air pressure can result in damaged wafers, negatively affecting the overall throughput of an SRD module.

Yet another drawback associated with conventional SRD modules is implementing unbalanced spindle fingers. Typically, the spin, rinse, and dry operations are performed at high RPMs while spindle fingers engage the wafer. Once the spinning operation has concluded, the chuck, the spindle fingers, and the wafer are expected to stop rotating. To the contrary, the engaged wafer sometimes continues to rotate for a split period of time thereafter, damaging the edge of the wafer, thus potentially reducing the overall throughput of the module. Furthermore, in some conventional SRD modules the spindle fingers may sometimes open up during the SRD operation, allowing the wafers to escape the grasp of the spindle fingers. This, of course, will damage the wafers.

Still another challenge faced in using typical SRD chucks and spindles is having chemically incompatible components present within the SRD module. In a typical SRD module, most components are constructed from several different materials. For instance, chucks are usually constructed from stainless steel, while the bowls are made out of polypropylene, and the spindles are made out of stainless steel. As a result, particles or contaminants from chemically incompatible components may enter into chemical reaction with the fluids introduced into the SRD module, recontaminating the SRD module. This recontamination is exacerbated by the chucks having to continuously move up and down (e.g., to load and unload each new wafer) within their respective bowls. For instance, as the chucks move up and down within their respective bowls, some of the chuck coating may flake off of the chuck, thus generating particulates and contaminants inside the bowl and the SRD module. In some cases, these contaminants may react with the residual chemicals (e.g., HF, $NH_3OH$, etc.) present in the SRD module from previous brush scrubbing operations. It is believed that these chemical reactions between the residual chemicals and the generated particulates and contaminants of the chuck may cause the recontamination of the wafer as well as the SRD module.

In view of the foregoing, a need therefore exists in the art for a chuck assembly that improves the spin, rinse, and dry operations while providing higher reliability.

SUMMARY OF THE INVENTION

Broadly speaking, the present invention fills these needs by a chuck assembly that improves the spin, rinse, and dry operations performed on substrates, while providing higher reliability and throughput. Preferably, the chuck assembly of the present invention is designed to apply compression force on the edge of the substrate being processed, thus preventing the chuck from possibly losing contact with the substrate during the spin, rinse, and dry operation. The chuck assembly of the present invention preferably has a flat cylindrical geometry and includes a plurality of gripper arms configured to simultaneously move so that grippers engage the substrate edge with a compression force being exerted onto the wafer edge by either the compression of a spring defined in each arm assembly of the chuck, or in another embodiment, deflection of a linkage spring that is coupled to each chuck link of the chuck assembly.

In one embodiment, a substrate holding apparatus is provided. The substrate holding apparatus includes a chuck yoke, a plurality of arm assemblies, and a plurality of gripper assemblies. A first end of each of the arm assemblies is connected to the chuck yoke and each of the arm assemblies has a spring. A second end of each of the arm assemblies is connected to a respective one of the plurality of grippers. The chuck yoke is capable of rotating so as to move each of the plurality of arm assemblies and respective plurality of gripper assemblies into either a closed position or an open position. A compression force from each of the springs is applied to a substrate when the grippers are moved to the closed position.

In another embodiment, a chuck assembly for use in a spin, rinse, and dry (SRD) module is provided. The chuck assembly includes a chuck yoke configured to rotate, a plurality of arm assemblies, and a plurality of gripper assemblies. Each of the plurality of arm assemblies is connected to the chuck yoke on a first end. Each of the plurality of arm assemblies includes a spring, an opening, and a pin. The opening has an open position and a closed position and the pin is defined in the open position in the opening. An initial rotation of the chuck yoke applies a force onto the plurality of arm assemblies causing the plurality of arm assemblies to move. A secondary rotation of the chuck yoke causes each of the plurality of the springs to compress moving the pin from the open position to the closed position. A second end of each of the arm assemblies is connected to a respective one of the plurality of gripper assemblies. The chuck yoke is capable of rotating to move each of the plurality of arm assemblies and respective plurality of gripper assemblies into a closed position. A compression force from each of the linkage springs is applied to a substrate when the gripper assemblies are moved to the closed position.

In yet another embodiment, an arm assembly for use in a chuck assembly of a spin, rinse, and dry (SRD) module is provided. The arm assembly includes a linkage arm, a yoke arm, a spring, and a pin. The linkage arm includes an outer shell, which defines a chamber. The linkage arm further includes a linkage arm opening defined along a portion of the chamber. The yoke arm has a yoke arm body a front portion of which is capable of being inserted within the chamber. The yoke arm body includes a yoke arm opening configured to be aligned with the linkage arm opening. The spring is disposed between the yoke arm and the linkage arm and is configured to be wrapped around the front portion of the yoke arm. The pin is disposed within the linkage arm opening and the yoke arm opening and is configured to move between an open position and a closed position so as to limit a compression of the spring.

In still another embodiment, a chuck assembly for use in a spin, rinse, and dry module (SRD) module is provided. The chuck assembly includes a chuck yoke, a plurality of chuck links, a plurality of linkage springs, and a plurality of gripper assemblies. Each of the plurality of chuck links has a first end and a second end. Each of the plurality of chuck links is configured to be connected to the chuck yoke on the first end. A stopper chuck link of the plurality of chuck links is configured to be longer than a remaining chuck links of the plurality of chuck links. Each of the plurality of linkage springs is connected to a respective chuck link on the second end. A second end of each of the chuck links is connected to a respective one of the plurality of gripper assemblies. The chuck yoke is capable of rotating so as to move each of the plurality of chuck links and respective plurality of gripper assemblies into a closed position. A compression force from each of the linkage springs is applied to a substrate when the gripper assemblies are moved to the closed position.

A gripper arm for use in a spin, rinse, and dry module is provided. The gripper arm includes a flat member and a gripper member. The flat member has a rectangular shape and has a first weight. A gripper having a second weight is configured to be mounted on a first side of the flat member. The gripper member has a third weight and is defined on a second side of the flat member. The third weight is configured to be more than the first weight. A total of the first weight and the second weight are equivalent to the second weight.

It should be appreciated that the present invention can be implemented in numerous ways, including as a process, an apparatus, a system, a device, or a method. Several inventive embodiments of the present invention are described below.

The advantages of the present invention are numerous. Primarily, the chuck assembly of the present invention securely engages the substrate being processed by applying consistent, constant, and equal force onto the edge of the substrate being processed. The force is being generated as a result of the deflection or compression of an associated spring. Another advantage of the chuck assembly of the present invention is that the gripper arms of the present invention are designed not to open during the SRD operation thus eliminating the possible reduction in throughput associated with the prior art chuck assemblies. Another advantage of the chuck assembly of the present invention is that the chuck assembly is constructed from a material yielding significantly high resistance to aggressive chemicals. Yet another advantage is that using the chuck assembly of the present invention has significantly reduced the period of time required for removing and reinstalling of the chuck assembly for maintenance. Still another advantage of the present invention is that the chuck assembly has a flat cylindrical geometry. Yet another advantage of the chuck assembly is that the chuck assembly includes a plurality of grippers configured to simultaneously move so as to engage and disengage the process wafer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A is a top view of a chuck assembly, in accordance with another embodiment of the present invention.

FIG. 2B is a bottom view of a chuck assembly, in accordance with yet another embodiment of the present invention.

FIG. 4A is an exploded view of a fully assembled chuck, in accordance with still another one embodiment of the present invention.

FIG. 4B is an exploded view of an arm assembly, in accordance with yet another embodiment of the present invention.

FIG. 5 is an isometric view of an arm assembly, in accordance with still another embodiment of the present invention.

FIG. 6 is an exploded view of an arm assembly, in accordance with still another embodiment of the present invention.

FIGS. 7A-1 is a top view of an arm assembly as connected to the gripper arm having a gripper mounted thereon when the chuck assembly is in an open position, in accordance with yet another embodiment of the present invention.

FIGS. 7A-2 is a side view of the top portion of the lead screw of the spindle when chuck is in an open position as shown in FIGS. 7A-1, in accordance with still another embodiment of the present invention.

FIGS. 7B-1 is a top view of an arm assembly as connected to the gripper arm having a gripper mounted thereon when the gripper engages the wafer, in accordance with yet another embodiment of the present invention.

FIGS. 7B-2 is a side view of the top portion of the lead screw of the spindle when the gripper engages the wafer as shown in FIGS. 7B-1, in accordance with still another embodiment of the present invention.

FIGS. 7C-1 is a top view of an arm assembly as connected to the gripper arm having a gripper mounted thereon when the chuck assembly is in a closed position, in accordance with yet another embodiment of the present invention.

FIGS. 7C-2 is a side view of the top portion of the lead screw of the spindle when chuck is in a closed position as shown in FIGS. 7C-1, in accordance with still another embodiment of the present invention.

FIG. 14F is an exploded isometric view of a spring assembly, in accordance with still another embodiment of the present invention.

FIGS. 15A-1 is a top view of a stopper chuck link as connected to the gripper arm having a gripper mounted thereon when the chuck assembly is in an open position, in accordance with yet another embodiment of the present invention.

FIGS. 15A-2 is an isometric view of the linkage spring when the chuck is in an open position, in accordance with still another embodiment of the present invention.

FIGS. 15A-3 is a side view of the top portion of the lead screw of the spindle when chuck is in an open position as shown in FIGS. 15A-1, in accordance with still another embodiment of the present invention.

FIGS. 15B-1 is a top view of the stopper chuck link as connected to a gripper arm having a gripper mounted thereon when the gripper engages the wafer, in accordance with yet another embodiment of the present invention.

FIGS. 15B-2 is an isometric view of the linkage spring when the gripper engages the wafer, in accordance with still another embodiment of the present invention.

FIGS. 15B-3 a side view of the top portion of the lead screw of the spindle when the gripper engages the wafer as shown in FIGS. 15B-1, in accordance with yet another embodiment of the present invention.

FIGS. 15C-1 is a top view of a stopper chuck link as connected to the gripper arm having a gripper mounted thereon when the chuck assembly is in a closed position, in accordance with still another embodiment of the present invention.

FIGS. 15C-2 is an isometric view of the linkage spring when the chuck is in the closed position, in accordance with yet another embodiment of the present invention.

FIGS. 15C-3 is a side view of the top portion of the lead screw of the spindle when chuck is in the closed position as shown in FIGS. 15C-1, in accordance with still another embodiment of the present invention.

FIG. 16A is an enlarged top view of the linkage spring, in accordance with yet another embodiment of the present invention.

FIG. 16B is an enlarged side view of the linkage spindle, in accordance with yet another embodiment of the present invention.

DETAILED DESCRIPTION OF THE PREFERRED EMBODIMENTS

Figure 1:
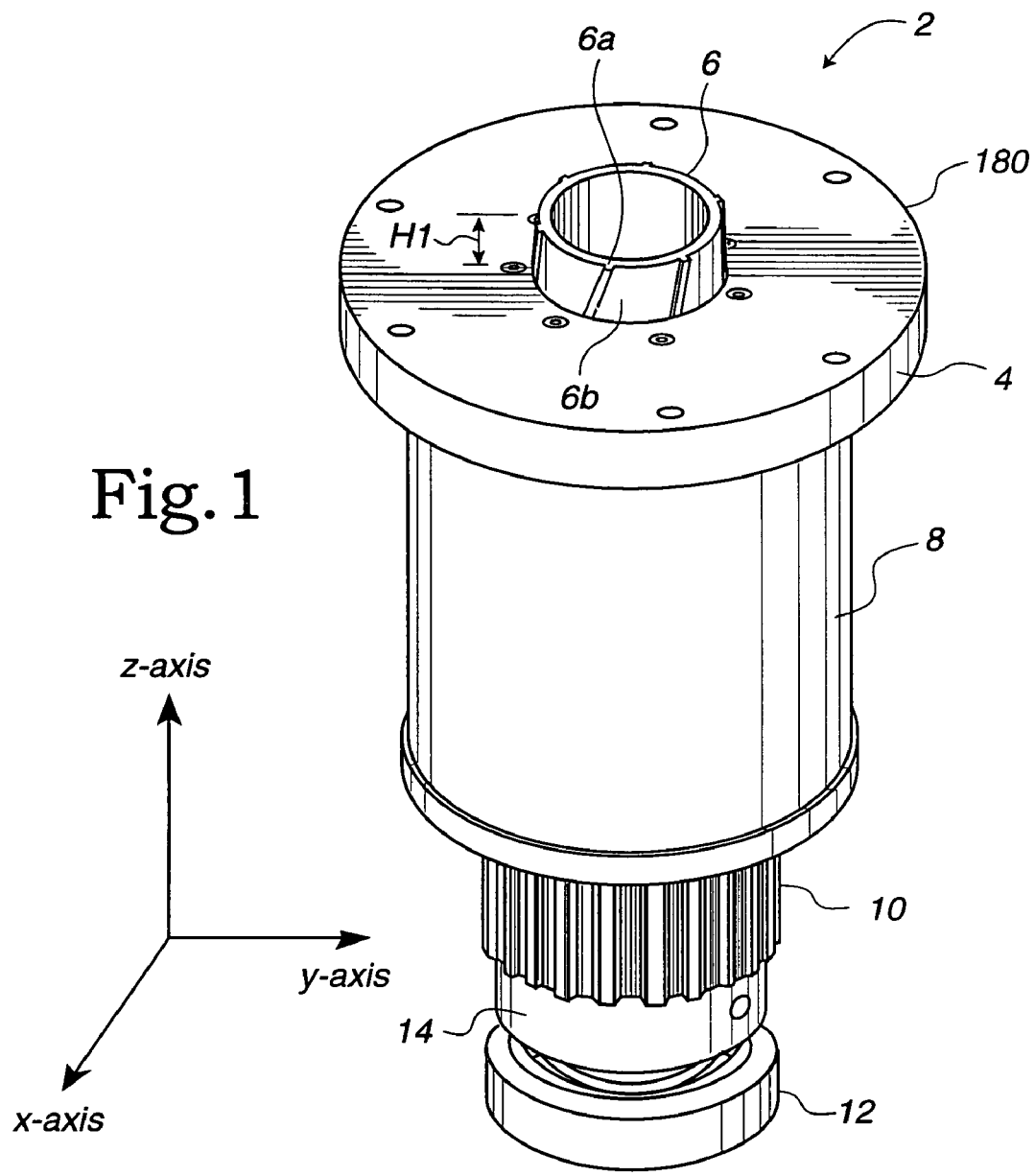
FIG. 1 shows an exemplary spindle assembly for use with the exemplary chuck assembly of the present invention in a spin, rinse, and dry (SRD) module, in accordance with one embodiment of the present invention.

Embodiments of a spin, rinse and dry (SRD) module and a chuck assembly for use in an SRD module for improving processing of substrate surfaces are described. The SRD module of the present invention includes a chuck assembly that improves the spin, rinse, and dry operations performed on substrates, while providing higher reliability and throughput. Preferably, the chuck assembly of the present invention is designed to apply compression force through each gripper that is in contact with the substrate edge, thus preventing the gripper arms from potentially losing contact with the substrate during processing. The chuck assembly of the present invention preferably has a flat cylindrical geometry and includes a plurality of gripper arms configured to simultaneously move so that grippers engage the substrate with consistent and constant compression force. The applied compression force is generated by the compression of a spring integrated in each arm assembly, or, in another embodiment, the deflection of a linkage spring that is coupled to each chuck link of the chuck assembly.

In one embodiment, the chuck assembly includes a plurality of arm assemblies each coupled to a yoke concentrically defined within the chuck body, on the first end, and to a respective linkage, on the second side. Each linkage is coupled to a gripper arm having a respective substrate retainer mounted thereon (e.g., gripper). Each arm assembly has two components, a linkage arm and a yoke arm. Each linkage arm is coupled to a respective linkage, on the one side, and is in contact with the yoke arm, on the other side. The linkage arm includes a hollow chamber configured to embrace the yoke arm. The linkage arm further includes an opening designed to include a spiral pin configured to move between an open position and a close position, or vice versa, when the chuck is in an open or a closed position, respectively. The yoke arm includes a protruded member on the side nested inside the linkage arm and is coupled to the yoke arm on the second side. A spring is defined between the linkage arm and the yoke arm in the fully assembled arm assembly.

Engaging of the substrate using compression force so as to prevent the wafer from potentially fleeing the grasp of grippers can start by inserting the substrate to be processed into the SRD bowl. Then, the linear movement of the spindle assembly, as controlled by the pneumatic control, causes the lead screw to move downwardly resulting in the lead screw male threads to engage with female threads defined in the yoke central aperture of the yoke. The engaging of the female threads and the male threads translates the linear movement of the lead screw into rotational movement causing the yoke to move.

At this point, rotation of the yoke applies force onto the yoke arm coupled to the yoke, pushing the yoke arm. Movement of the yoke arm base causes the yoke arm body to move. As a result, the movement of the arm assemblies results in each of the grippers to move so as to come into contact with the wafer. Once the wafer is contacted, the lead screw and thus the yoke will move an additional short distance, causing the yoke arm to apply pressure on the spring. The spring will then be compressed until the pin moves from an open position to the closed position. Compression of the spring applies compression force onto the gripper arms, forcing the grippers to engage the wafer using the compression force, thus preventing the wafer from potentially flying off during the spinning operation.

In another embodiment, the chuck assembly includes a plurality of chuck links coupled to a respective linkage spring connected to an associated gripper arm. In one example, the chuck includes a stopper chuck link and three remaining chuck links wherein a length of the stopper chuck link is longer than the length of the remaining chuck links. According to one implementation, after the process wafer is inserted into the SRD bowl, the stopper chuck link is pushed forward by the rotational movement of the yoke thus causing the spring actuating element of the spring linkage to move closer to the inner sidewall of the chuck body. Once the wafer is engaged by the grippers the lead screw is configured to travel an additional distance. Thereafter, the lead screw continues to travel until a tip of the stopper chuck link contacts with the inner sidewall of the chuck body, which limits the deflection of the spring. As a result, the connecting beam is deflected to a repeatable dimension. At this juncture, the grippers engage the substrate using the compression force thus preventing the grippers from possibly losing contact with the substrate during the SRD operation. In this manner, the substrate is securely engaged while the module is in operation and cannot fly off despite being rotated at high revolutions per minute (RPMs) during the substrate preparation in the SRD module.

In a preferred embodiment, the compression force applied onto the substrate edge is consistent because the compression force is generated as a result of the compression of the springs in each of the arm assemblies or the linkage springs coupled to the chuck links. Thus, so long as the springs/linkage springs are in the compressed state, the compression force is consistent. Furthermore, in another preferred embodiment, the compression force applied onto the substrate edge is constant as substantially the same compression force is being applied while the substrate is engaged during processing. Additionally, in another preferred embodiment, the compression force being applied onto the substrate edge is equal, as equal compression force generated by the corresponding attached compressed springs is being applied by a plurality of grippers, thus engaging the edge of the substrate in substantially equal distance.

FIG. 1 shows an exemplary fully assembled spindle assembly 2, in accordance with one embodiment of the present invention. The spindle assembly 2 includes a cylindrical spindle housing 8 coupled to a cylindrical spindle mounting plate 4. The spindle assembly 2 also includes a cylindrical shape linear chuck actuator bearing 12 and a pulley 10 coupled to a chuck clearance and an internal spindle shaft (not shown) using a screw.

A lead screw 6 is concentrically housed inside the spindle housing 8 and is configured to move upwardly and downwardly within the spindle assembly 2. In one example, the lead screw 6 is configured to move downwardly within the spindle housing 8 and through a central aperture 9 defined in the spindle mounting plate 4. In the embodiment of FIG. 1, the lead screw 6 is shown to be in an upper position as an upper portion 6b of the lead screw 6 protrudes above the spindle mounting plate 4.

The upper portion 6b of the lead screw 6 is shown to have a height of H1. As further shown, a plurality of male threads 6a is defined on the outer surface of the upper portion 6b of the lead screw 6. As will be discussed in more detail below, the plurality of male threads 6a is configured to engage with a plurality of female threads 26a (not shown in this Figures) defined in a chuck yoke 26 of the chuck assembly. In this manner, the downwardly movement of the lead screw 6 is translated to a rotational movement of the yoke 26.

Although not shown, in one embodiment, the pulley 10 is attached to a belt and servo motor so that when the servo motor is in operation, the pulley 10 causes the spindle shaft to rotate within the spindle housing 8, causing the chuck assembly and the process wafer to rotate. In accordance with one preferred embodiment, the spindle housing 8 is constructed from Stainless Steel.

The illustrated spindle assembly 2 is in the upper position, because the upper portion 6b of the lead screw 6 protrudes above the top surface of the spindle mounting plate 4. In one embodiment, the spindle housing 8 is defined in fixed z-axis (i.e., stationary). For additional information on the mechanism of the spindle assembly 2, reference can be made to: U.S. patent application Ser. No. 10/186,563, filed on Jun. 28, 2002, having inventor Randolph E. Treur, and entitled "SPIN, RINSE, AND DRY MODULE AND METHODS FOR MAKING AND IMPLEMENTING THE SAME." This U.S. Patent Application, which is assigned to Lam Research Corporation, the assignee of the subject application, is incorporated herein by reference.

In one embodiment, when the lead screw 6 is in the lower position, a pocket having a height H1 exists between a cylindrical lower edge of the spindle housing 8 and a cylindrical upper lip of the pulley 10. However, such pocket does not exist when the lead screw 6 is in the upper position. Thus, when the spindle assembly 2 is in the lower position, a lower portion of the lead screw sticks out below the bottom portion of the Pulley 10. The protruded lower portion of the lead screw 6 also has the height H1.

The components of the spindle assembly 2 are advantageously constructed from materials yielding a higher resistance to aggressive chemicals (e.g., highly concentrated HF, highly concentrated Ammonia, Citric Acid Solutions, EKC 640, etc.). Furthermore, in one embodiment, the spindle assembly 2 can be made from Torlon as Torlon TORLON™ can endure harsh thermal, chemical, and stress conditions. TORLON can be used in a broad range of applications such as extruded, injection molded, and compression molded grades. TORLON™ is a high performing and melt processable plastic. The components of the spindle assembly 2 constructed from TORLON™ provide greater compressive strength and higher impact resistance than most advanced engineering plastics.

As will be described in more detail below, the spindle assembly 2 can be used in conjunction with the chuck assembly of the present invention so as to prevent the process substrates from escaping the grasp of grippers during spin, rinse, and dry operations.

Reference is made to FIG. 2A showing a top view of a fully assembled chuck assembly 100 of the present invention, in accordance with one embodiment of the present invention. The chuck assembly 100 includes a circular chuck cover 18 having a central passage 18a therein. As can be seen, the yoke 26 having the plurality of female treads 26a defined on an inner surface 26b of the yoke 26 is disposed in the chuck cover passage 18a.

FIG. 2A shows two grippers 32 each of which is coupled to a respective gripper arm 20. Each gripper arm 20 is coupled to the chuck cover 18 using a respective gripper link pin 40. In the embodiment illustrated in FIG. 2A, the chuck assembly 100 is in an open position. In one embodiment, the gripper arms 20 are configured to move in a movement direction 27 while the chuck is shown to rotate in an opposite direction, movement direction 21. As can be seen, in one preferred embodiment, the gripper arms 20 are shown to be L-shaped. Additional information with respect to the structure of gripper arms 20 as well as the chuck mechanism and operation will be provided below.

Continuing to FIG. 2B a bottom view of the chuck assembly 100 is shown, in accordance with one embodiment of the present invention. As illustrated, the chuck assembly 100 has a cylindrical-shape chuck body 16 and a plurality of arm assemblies 23. Each arm assembly 23 is shown to be coupled to a respective linkage 52 on a first end 23f and to the yoke 26 on a second side 23s.

As can be appreciated, in one preferred implementation, the chuck body 16 is constructed such that a plurality of ribs 16b separate a plurality of carved sections 16a. In this manner, a weight of the chuck body 16 is reduced, thus enabling the chuck assembly 100 to operate with less power. Additionally, in one embodiment, the chuck body 16 can be machined easier. In the embodiment shown in FIG. 2B, four ribs 16b are shown to separate four carved sections 16a. Each rib 16b is shown to have a respective half-square-shaped carved portion 16b-1. Each linkage 52 is shown to be disposed in a respective carved portion 16b-1.

As can be seen, the plurality of arm assemblies 23 is shown to be defined such that a first end 23f of each arm assembly 23 is coupled to the respective linkage 52 and the second side 23s of the arm assembly 23 is coupled to the yoke 26. Furthermore, an opening 60 is defined in the exposed side of each arm assembly 23. A spiral pin 62 is pinned in each opening 60, which in the implementation shown in FIG. 2B, is defined at an open position, at point "A." As can be appreciated, the first end 23f of each arm assembly is not configured to come into contact with a chuck inner sidewall 16d. Thus, in the embodiment shown in FIG. 2B, the chuck assembly 100 is in an open position.

Figure 3A:
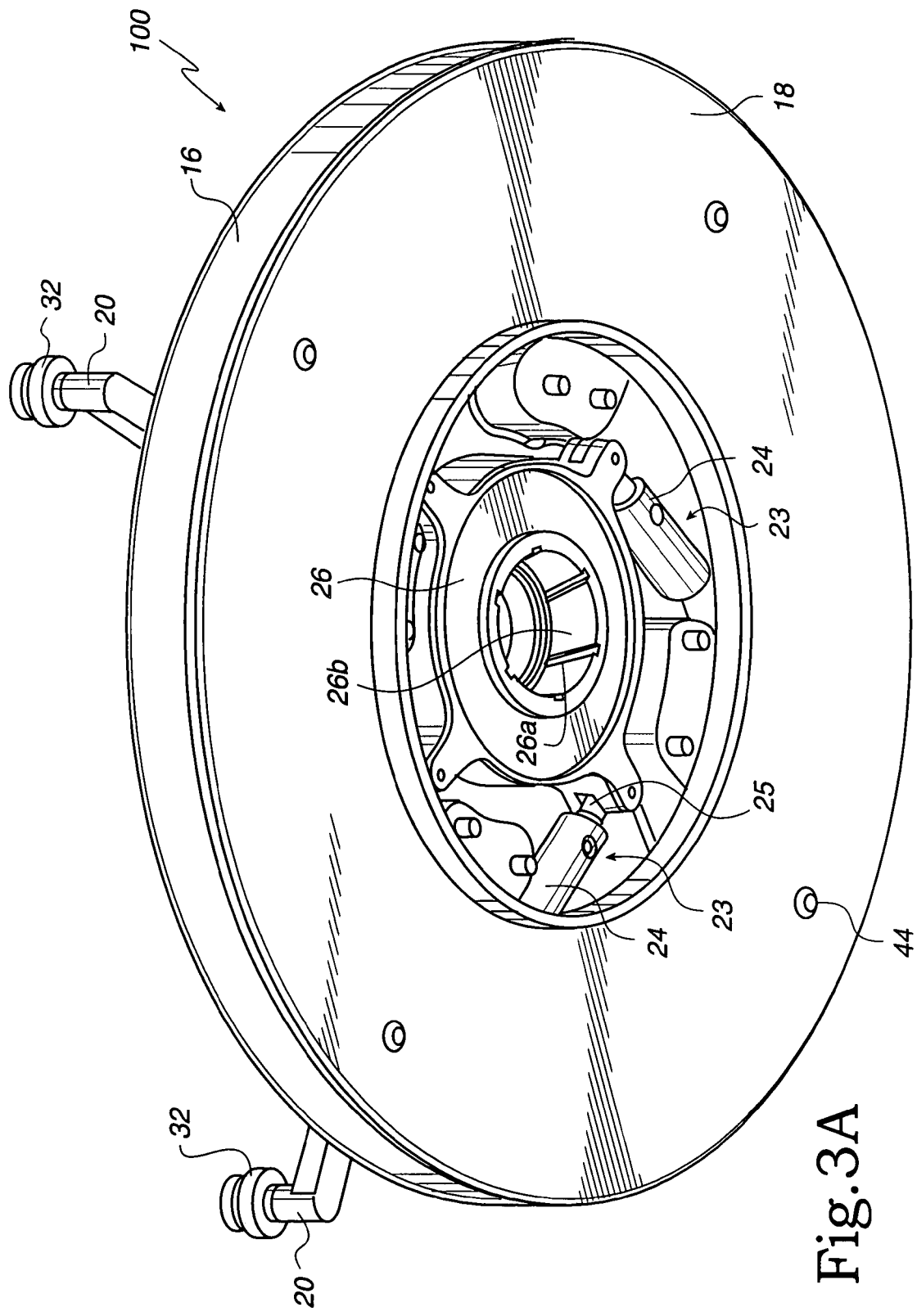
FIG. 3A is a bottom view of an assembled chuck assembly, in accordance with still another embodiment of the present invention.

FIG. 3A is an isometric view of a fully assembled chuck assembly 100, in accordance with one embodiment of the present invention. As can be seen, the chuck body 16 is coupled to a chuck backside cover 18 using a plurality of button caps 44. In the embodiment of FIG. 3A, four button caps 44 have been used. The plurality of grippers 32, as mounted on the respective gripper arms 20, is shown to be coupled to the chuck body 16.

Further shown is the plurality of arm assemblies 23, as connected to the yoke 26 on the second side 23s. Also shown is the plurality of female treads 26a defined on the inner surface 26b of the yoke 26 configured to engage with the plurality of male treads 6a of the lead screw 6. In this manner, the linear movement of the lead screw 6 is translated to the movement of the chuck body 16, arm assemblies 23, and thus the gripper arms 20. Additional information with respect to the movement mechanism of the chuck, yoke, arm assemblies, and gripper arms are provided below.

Figure 3B:
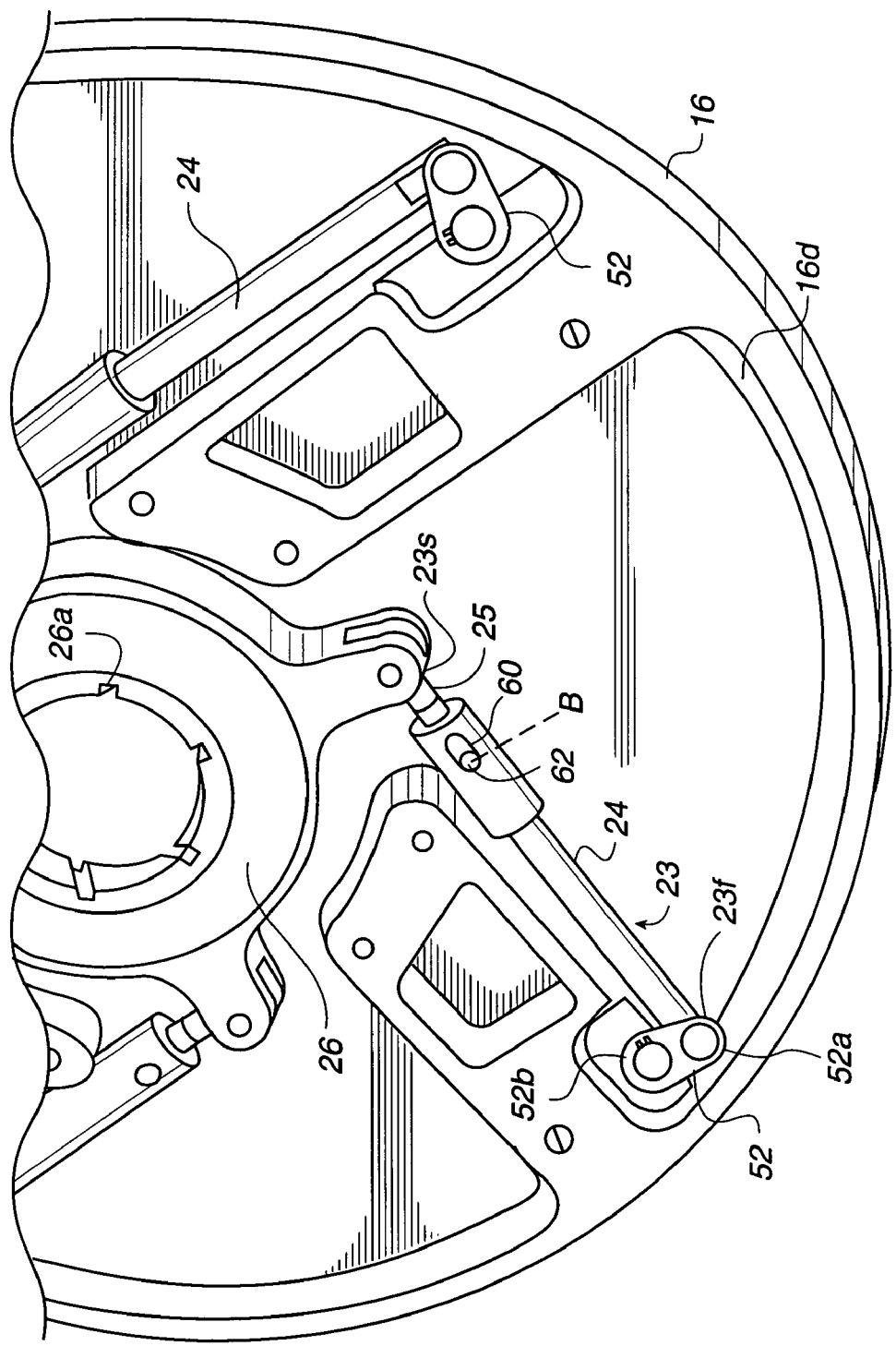
FIG. 3B is a bottom view of a chuck assembly, in accordance with yet another embodiment of the present invention.

Moving to FIG. 3B, the bottom view of the chuck assembly 100 in a closed position is depicted, in accordance with one embodiment of the present invention. As can be seen, very small gaps can be seen between the first end 23f of each arm assembly 23 and the inner sidewall 16d of the chuck body 16. In a like manner, the space existing between the linkage first side 52a and the chuck inner sidewall 16d of the chuck body 16 has also been reduced substantially. However, in one preferred embodiment, the first side 52a of the linkages 52 and the first end 23f of the arm assemblies 23 do not come into contact with the chuck inner sidewall 16d of the chuck body 16.

In the embodiment shown in FIG. 3B, the spiral pin 62 is shown to be in a closed position, as defined at point "B." Thus, in accordance with one embodiment of the present invention, the chuck assembly 100 eliminates the possibility of process wafers escaping the hold of the grippers 32 during the SRD operation as a result of fluctuations in air pressure by exerting consistent compression force on the wafer edge using compression of springs integrated within each of the arm assemblies 23. In one preferred embodiment, the spiral pin 62 is in an open position when the spring integrated in each arm assembly is in the relaxed position. Once the yoke 26 starts to rotate, the rotation of the yoke 26 applies force to the arm assemblies 23 causing the arm assemblies to move until the wafer is engaged. At this point, the yoke 26 continues to move the additional distance causing the yoke arm 25 apply force onto the spring 58, contracting the spring 58. The compression of the springs causes the spiral pin 62 to move from the open position to the closed position. As can be appreciated, the movement of the spiral pin 62 is limited between the lower boundary and the upper boundary of the opening 60. In this manner, when the pins 62 are in position, the wafer is gripped with consistent and constant compression force generated by the compression of the springs 58.

Shifting to FIG. 4A, an exploded detailed view of a fully assembled chuck assembly 100 is depicted, in accordance with one embodiment of the present invention. In the fully assembled chuck 100, the chuck body 16 is shown to be disposed between the chuck backside cover 42 and the chuck cover 18. As can be seen, the chuck backside cover 42 is coupled to the chuck body 16 using four button caps 44. The chuck backside cover 42 includes a concentric backside cover orifice 42a. As will be discussed in more detail below, the yoke 26, as coupled to the arm assemblies 23, is defined concentrically within the backside cover orifice 42a, when the chuck assembly 100 is fully assembled.

In a like manner, the chuck cover 18 is coupled to the chuck body 16 using a plurality of (e.g., four) screws 22. A backside plate bearing 34 is defined on an inner surface of the passage 18a of the chuck cover 18 while a chuck assembly seal 28 is placed on an outer surface of the passage 18a. An O-ring 30 is secured to the inner edge of the chuck cover 18 prior to coupling the chuck cover 18 to the chuck body 16.

As illustrated, the chuck body 16 includes four ribs 16b designed to separate adjacent carved sections 16a defined within the bottom surface of the chuck body. Each rib 16b has a respective half-square-shaped carved portion 16b-1 allowing each of the respective arm assembly 23 to be coupled to the corresponding carved portion 16b-1. One of the benefits of defining the carved sections 16a in the chuck body 16 is that the operation of the chuck assembly 100 requires less energy due to the reduction in the weight of the chuck body. In one embodiment, machining of the chuck body 16 can also be simplified as less number of stages can be used.

Four linkages 52 are defined on and inside the chuck body 16 such that a respective linkage 52 is mounted on each of the carved portions 16b-1. As can be appreciated, the plurality of grippers 32 mounted on the respective gripper arms 20 is attached to the outer surface of the bottom wall of the chuck body 16. The gripper arms 20 are coupled to the respective linkage 52 by gripper pins 41 through the bottom wall of the chuck body 16. As can be seen, in the embodiment of FIG. 4A, four grippers 32, four gripper arms 20, four arm assemblies 23, and four gripper pins 41 are implemented. However, in a different embodiment, any appropriate number of grippers, gripper arms, arm assemblies, and linkages can be implemented so long as the number of components corresponds. In this manner, the arm assemblies 23, the gripper arms 20, and the grippers 32 can apply substantially equal and identical compression force on the edge of the wafer, thus maintaining consistent and constant grip on the wafer during SRD operations.

As illustrated, the yoke 26 is coupled to the second side 23s of each arm assembly 23 while the first end 23f of each arm assembly 23 is coupled to the respective linkage 52. In this manner, movements of the yoke 26 applies force to the arm assemblies 23, thus moving the first end 23f of the arm assemblies 23 closer to the chuck inner sidewall 16d. In one example, at this point, the grippers 32 engage the process wafer 3. In accordance with one preferred embodiment of the present invention, so long as the yoke 26 rotates, the gripper arms 20 move so as to engage the wafer. Thereafter, the yoke 26 rotates slightly causing the yoke arms 25 to apply additional pressure to the springs 58, compressing the springs 58. However, the springs 58 are compressed until the spiral pins 62 reach the closed position (e.g., position "B"). At this point, the wafer is engaged using consistent and constant compression force applied generated by the compression of springs 58 needing to return to the relaxed position (e.g., position "A").

FIG. 4B is an enlarged exploded view of "A" depicted in FIG. 4A, in accordance with one embodiment of the present invention. As shown, the second side 23s of each arm assembly 23 is coupled to the yoke 26 using a respective spindle linkage pin 46 while the first end 23f of each arm assembly 23 is coupled to the respective linkage 52 using the associated link pin 50. In the embodiment shown in FIG. 4B, the arm assembly 23 is shown to be constructed from a linkage arm 24 and a yoke arm 25. Additional information regarding the structure and mechanism of the chuck assembly and arm assemblies 23 is provided below.

In one embodiment, the movement of the arm assembly 23 is transmitted to the gripper arms 20 using a retaining ring 56, an upper retaining ring E-ring 54, the linkage 52, a hole 24c, the link pin 50, and the lower retaining ring E-ring 48. For instance, the link pin 50 is pinned to the linkage 52 through the hole 24c. As shown, the link pin 50 is secured to the linkage 52 by the lower retaining ring E-ring 48 while the upper retaining ring e-ring 54 is clamped on the upper retaining ring 56.

The structure of an exemplary arm assembly 23 is shown in FIG. 5, in accordance with one embodiment of the present invention. The arm assembly 23 is multipart and is constructed from the linkage arm 24 and the yoke arm 25. As will be explained in more detail below, the linkage arm 24 has a linkage arm body 24a and a linkage arm outer shell 24b. Although not shown in FIG. 5, the linkage arm outer shell 24b includes a hollow chamber. The yoke arm 25 and the linkage arm 24 are substantially aligned so that the yoke arm 25 can be inserted into the linkage arm outer shell 24b such that the substantial portion of the yoke arm 25 is nested inside the chamber. The opening 60 is shown to include the spiral pin 62 configured to move between the open and closed positions.

Referring to FIG. 6, an isometric exploded view of an arm assembly 23 is shown, in accordance with one embodiment of the present invention. As can be seen, the yoke arm 25 has two sections, a yoke arm body 25b and a yoke arm base 25a. As further can be seen, a cylindrical protruded member 25e is defined on the outer surface of the yoke arm body 25b. In one example, the protruded member 25e can be a solid member.

The illustrated arm assembly 23 further includes the spring 58. In the example shown, the spring 58 is a spiral coil type spring. But, in a different embodiment, the spring 58 can be any appropriate type of spring (e.g., flat spring, compression spring, torsional spring, or extension spring, etc.). In one preferred embodiment, the arm assembly 23 is put together by fitting the spring 58 in the protruded member 25e and then inserting the yoke arm body 25b and thus the spring 58 inside the chamber defined inside the linkage arm outer shell 24b. Thereafter, to maintain the multipart arm assembly 23 together, the spiral pin 62 is inserted into the opening 60 defined in the linkage arm outer shell 24b and finally into the aperture 25d of the yoke arm 25.

Figures 1, 7A:
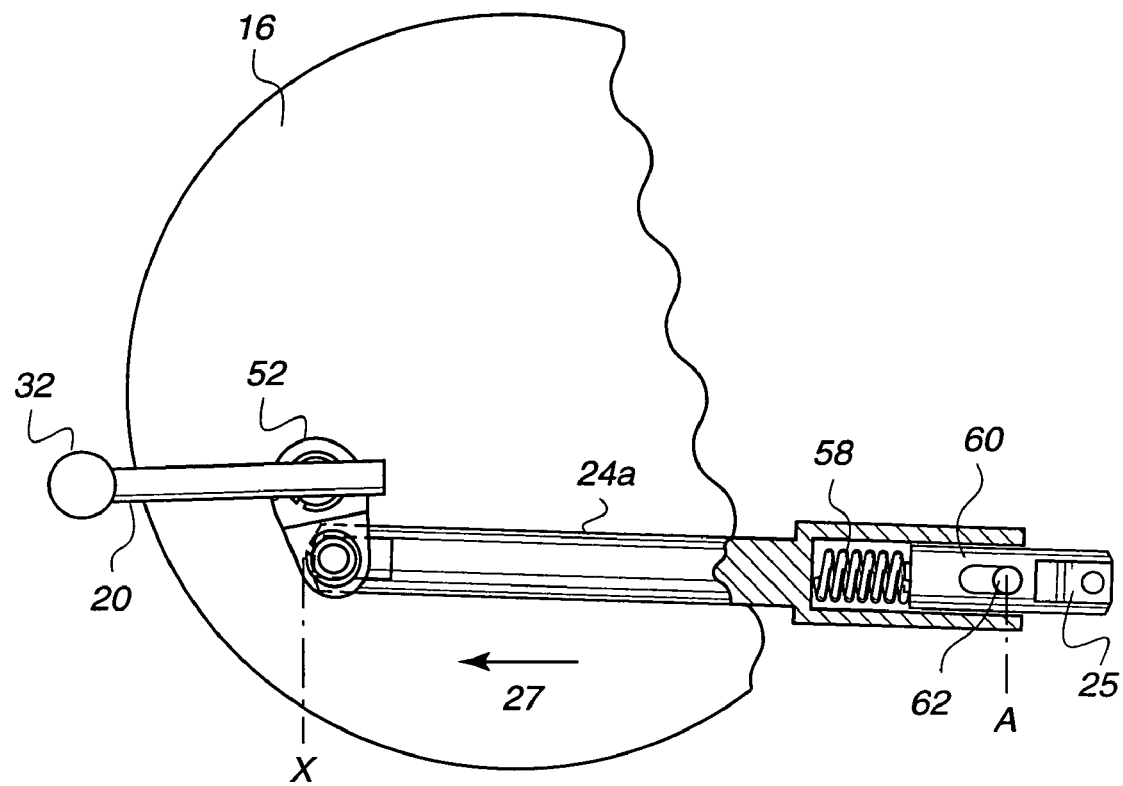
Figures 2, 7A:
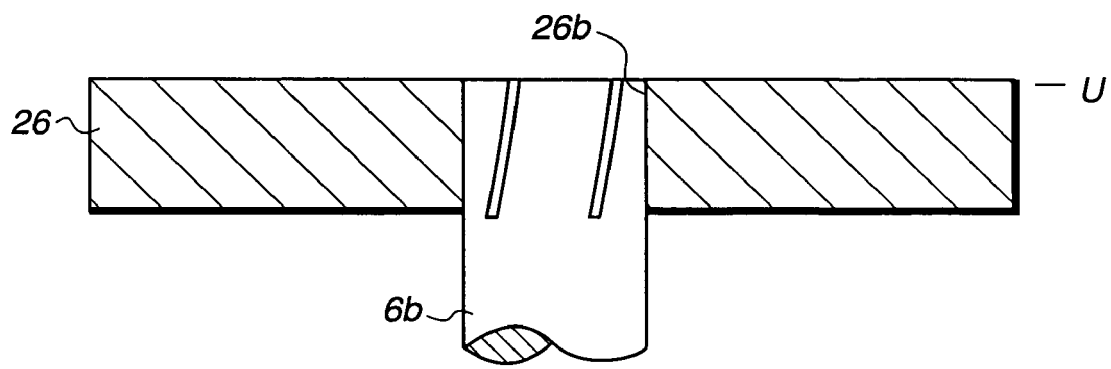

Movement mechanism of the components of the arm assembly 23 to engage a wafer in an exemplary chuck assembly of the present invention is illustrated in the simplified enlarged bottom view diagrams shown in FIGS. 7A-1 through 7C-2, in accordance with one embodiment of the present invention. FIGS. 7A-1 shows the alignment of the internal components of the arm assembly 23 when the chuck assembly 100 is in the open position. As can be seen, the spiral pin 62 is defined in close proximity to the upper portion of the opening 62 (i.e., the portion of the link arm 24 nesting the yoke arm 25). In this embodiment, the spring 58 is in the relaxed position and a gap exists between the linkage arm body 24a and the linkage 52. The gripper 32 is not contacting or engaging the wafer. At this point, as shown in FIGS. 7A-2, the upper portion 6b of the lead screw 6 is defined at substantially the same level as the yoke upper surface 26f, at Height U. That is, the lead screw 6 can no longer move downwardly within the yoke central aperture 26c of the yoke 26.

Figures 1, 7B:
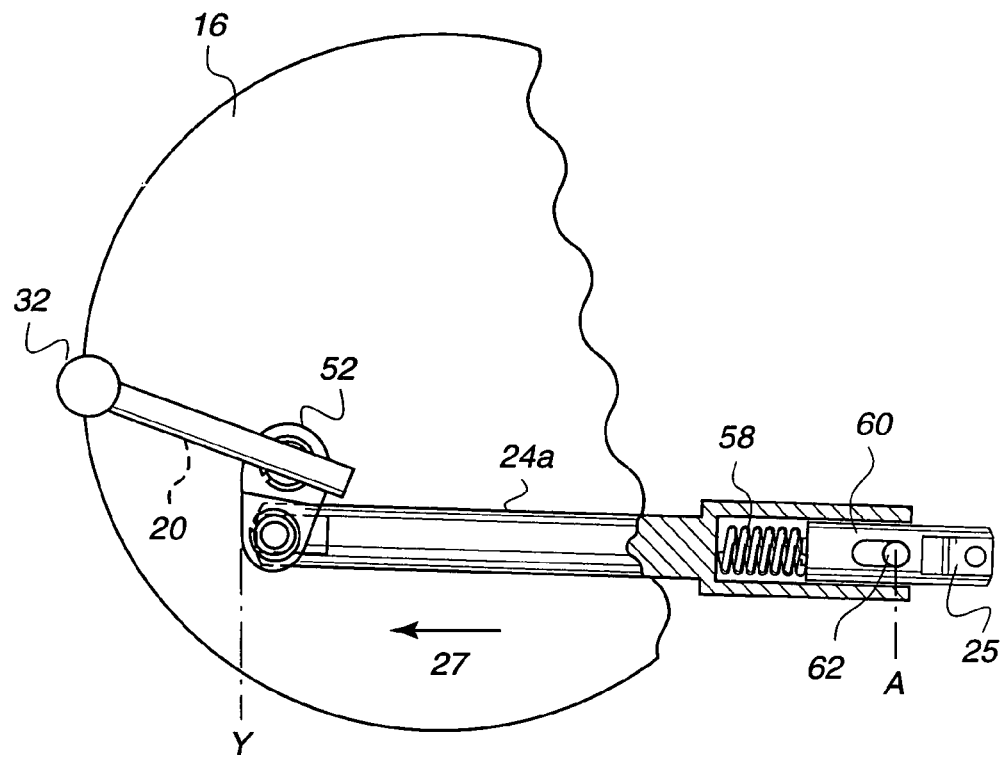
Figures 2, 7B:
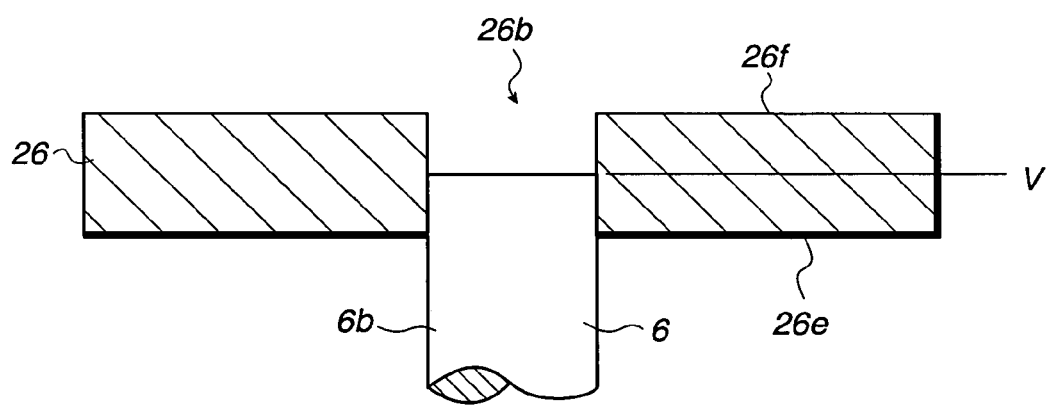

Proceeding to FIGS. 7B-1, respective positions of the arm assembly 23, the linkage 52, the gripper arm 20, and the gripper 32 when contacting the wafer are shown, in accordance with one embodiment of the present invention. In this embodiment, the spiral pin 62 is still defined at the position A. As further shown, the gap initially shown between the arm linkage body 24a and the linkage 52 with the chuck body 16 is substantially reduced, as the gap in FIGS. 7A-1 is defined between the periphery of the chuck body 16 and a position "Y." As shown, the spring 58 is still in the relaxed position.

In one embodiment, the movement of the lead screw 6 is translated to rotational movement causing the yoke 26 to rotate, which in turn, pushes the link assembly 23 toward the periphery of the chuck body 16. As a consequence, the gripper arm 20 and the grippers 32 also move. At this point, although the grippers 32 are in contact with the wafer 3, the grippers 32 may not yet be securely engaging the wafer so as to prevent wafer from potentially breaking loose during the wafer preparation in the SRD module.

Figures 1, 7C:
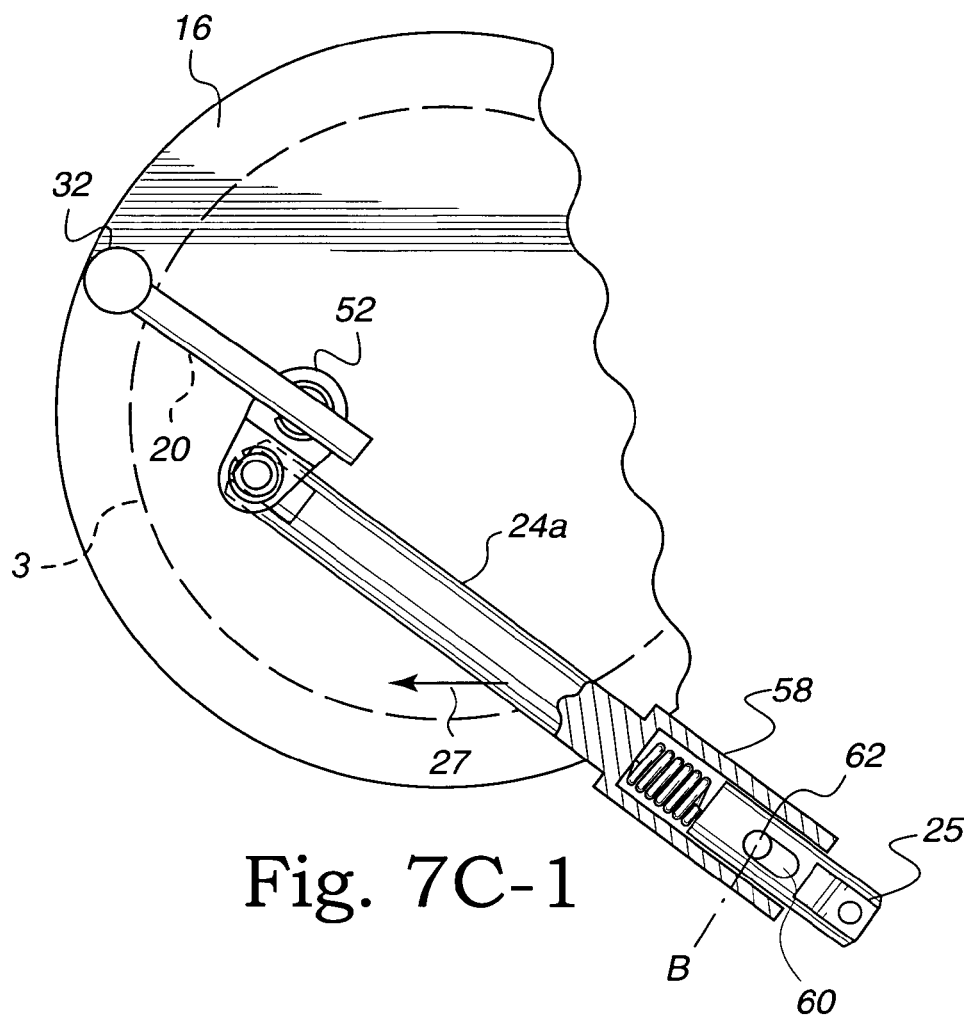
Figures 2, 7C:
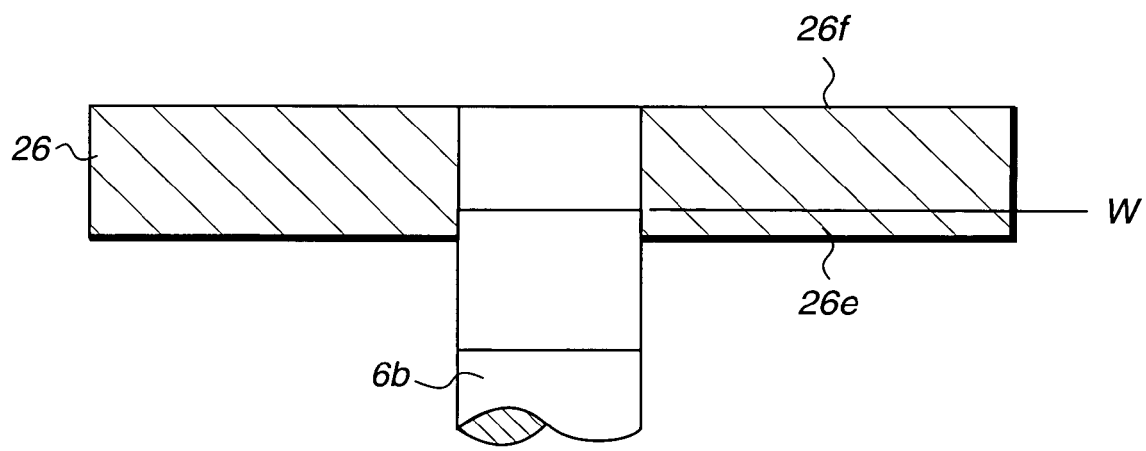

Proceeding to FIGS. 7C-1, the arrangement of the arm assembly 23, the linkage 52, the gripper arm 20, and the gripper 32 are illustrated when the chuck assembly is in the closed position. In this embodiment, the spiral pin 62 is defined at the position "B," as a result of the spring 58 being compressed. In this embodiment, the gripper 32 engages the wafer 3 using consistent compression force so as to prevent the wafer 3 from potentially escaping during the SRD operation.

As illustrated in FIGS. 7C-2, the top portion 6a of the lead screw 6 is in the lowest position the top portion 6a of the lead screw 6 may assume within the yoke 26. Thus, as can be seen, the top portion 6a of the lead screw 6 is defined at a height W as defined within the yoke inner surface 26b. In the same manner, the arm assemblies and grippers 32 cannot move any farther. As can be appreciated, the difference between the Height V and the Height W corresponds to the extent of compression of the spring 58 resulting from the rotational movement of the yoke 26. As the lead screw 6 can no longer move within the yoke 26 and the spring 58 cannot be compressed any farther, neither can the gripper arm 20 and thus the gripper 32. Accordingly, the wafer is prevented from possibly fleeing the grasp of the grippers 32 during the spin, rinse, and dry operations.

In one embodiment, when the chuck is closed and the springs are in the relaxed position, the gripper arm 20 as well as the gripper 32 is configured to apply compression force onto the edge of the wafer as if engaging a wafer having a smaller radius. In one example, the grippers 32 are configured to engage the wafer having an actual diameter of approximately 11.81 inches. However, when the chuck is in the closed position, the grippers are applying pressure on the wafer as if the wafer has a less diameter, for example, approximately 11.73 inches. In one preferred embodiment, each of the grippers can apply about approximately 8-12 pounds of compression force on the edges of the wafer on the point of the gripper contact, thus preventing the wafer from possibly flying off during the spin, rinse, and dry operations.

Engaging the wafer using consistent and equal compression force thus preventing the wafer from potentially fleeing the grasp of the grippers during SRD operation can be described as follows, in accordance with one embodiment of the present invention. Initially, the process wafer is inserted into the SRD bowl. Then, the linear movement of the spindle assembly, as controlled by the pneumatic control, causes the lead screw to move downwardly, resulting in the lead screw male threads to engage with female threads defined in the yoke central aperture 26c of the yoke 26. The engaging of the female threads and the male threads translates the linear movement of the lead screw 6 into rotational movement causing the yoke 26 to move in the rotation direction 26d.

At this point, rotation of the yoke 26 applies force onto the yoke arm 25 coupled to the yoke 26, pushing the yoke arm 25 in a direction 27. Movement of the yoke arm base 25a causes the yoke arm body 25b to move. Movement of the arm assemblies 23 results in each of the grippers 32 to move so as to come into contact with the wafer. Once the wafer is contacted, the lead screw 6 and thus the yoke 26 will move an additional short distance, causing the yoke arm 25 to apply force on the spring 58. The spring 58 will then be compressed until the pin 62 moves from point A to point B. Compression of the spring 58 applies compression force onto the gripper arms 20, forcing the gripper 32 to engage the wafer using compression force, thus preventing the wafer from potentially flying off during the spinning operation.

Specifically, the compression of the spring 58 allows the spiral pin 62 to move along the opening 62 from the position A to the position B. Thus, the wafer is engaged by all grippers 32 using the additional consistent, constant, and equal pressure applied to the wafer edge from the compression of the spring 58, as controlled by the movement of the pin 62 in the opening 60. In this manner, the wafer is securely engaged and cannot escape the grasp of the grippers 32 despite being rotated at high RPMs (e.g., approximately 3000 RPMs) during the wafer preparation in the SRD module. Of course, in one embodiment, the wafer can be engaged by the grippers 32 using consistent and constant compression force while the spiral pin is in an intermediate position C, a position defined between position A and position B.

Figure 8A:
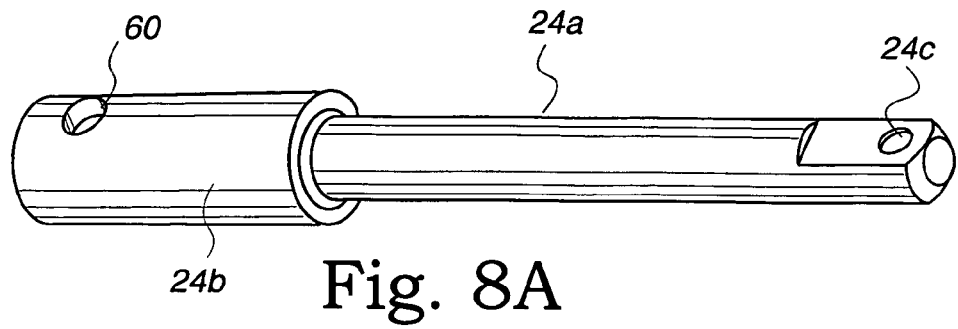
FIG. 8A is an isometric view of a linkage arm, in accordance with still another embodiment of the present invention.

The structure of the linkage arm 24 can be seen in the isometric view of FIG. 8A, in accordance with one embodiment of the present invention. As shown, in this embodiment, the linkage arm outer shell 24b is a substantially hollow cylinder which radius is greater than the radius of the linkage arm body 24a. An upper portion of the front section 24f of the linkage arm 24 is shown to be substantially flat having a hole 24c therein. The hole 24c is used to couple the linkage arm 24 to the linkage 52.

Figure 8B:
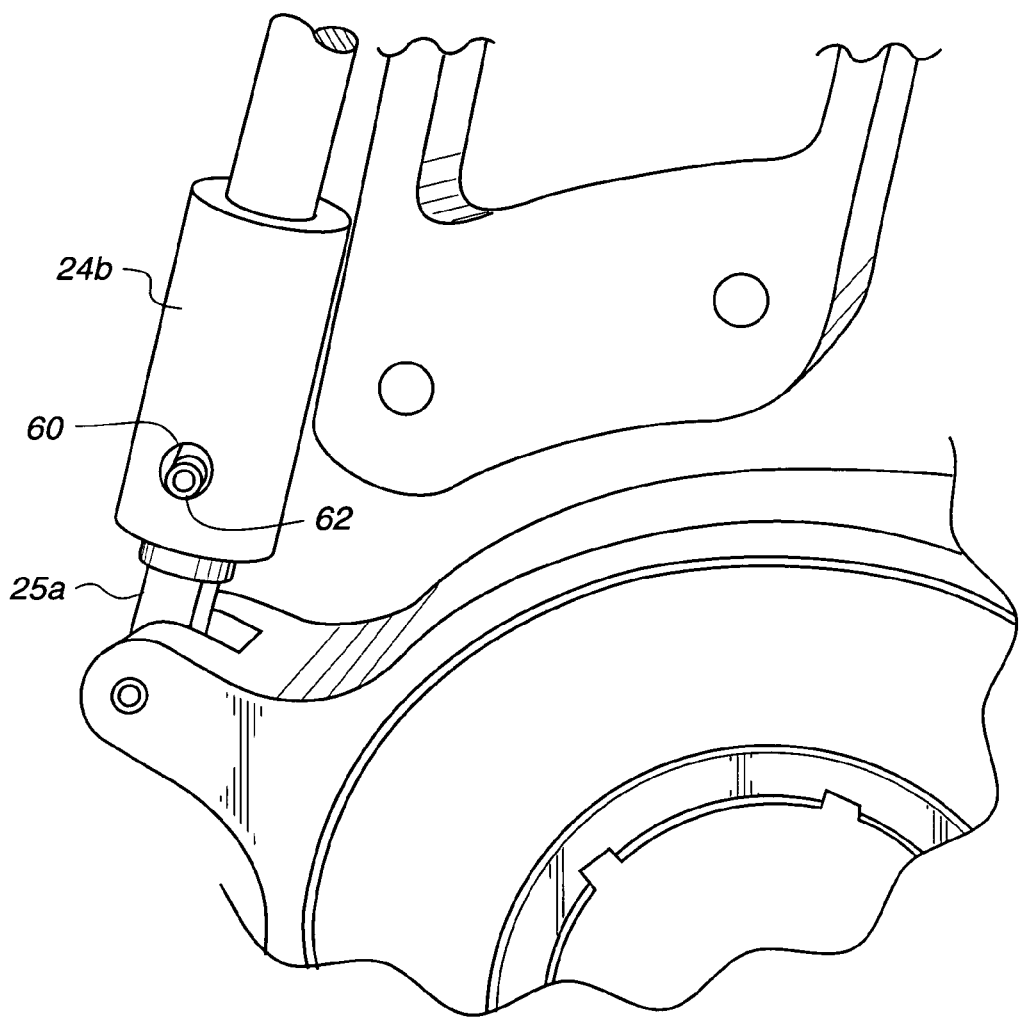
FIG. 8B is a picture of a linkage arm as defined in a chuck, in accordance with yet another embodiment of the present invention.
Figure 8C:
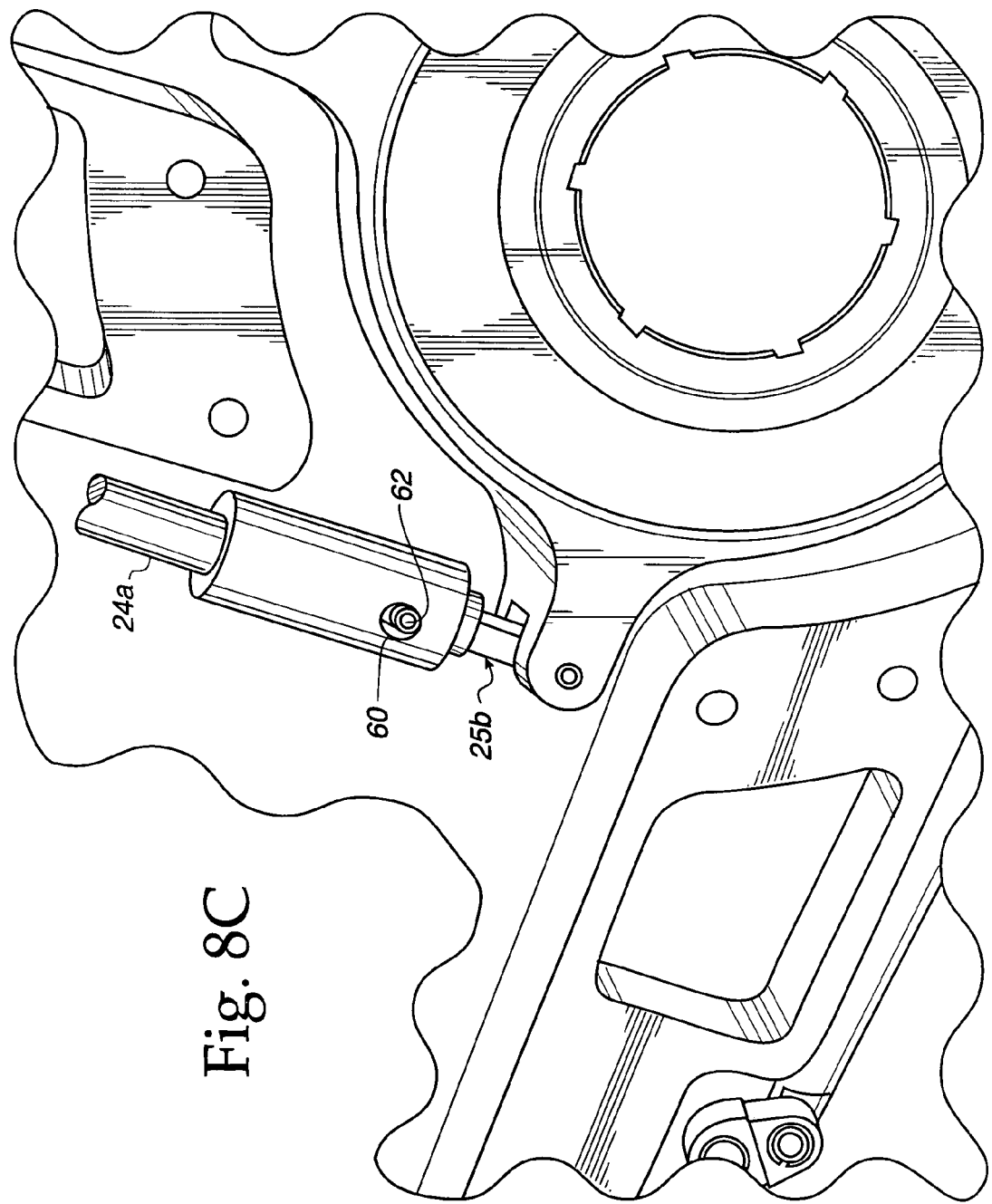
FIG. 8C is a picture of a linkage arm as defined in a chuck, in accordance with yet another embodiment of the present invention.

FIGS. 8B and 8C are pictures partially depicting the linkage arm 24, in accordance with one embodiment of the present invention. As can be seen, the spiral pin 62 is defined in the open position.

Figure 9:
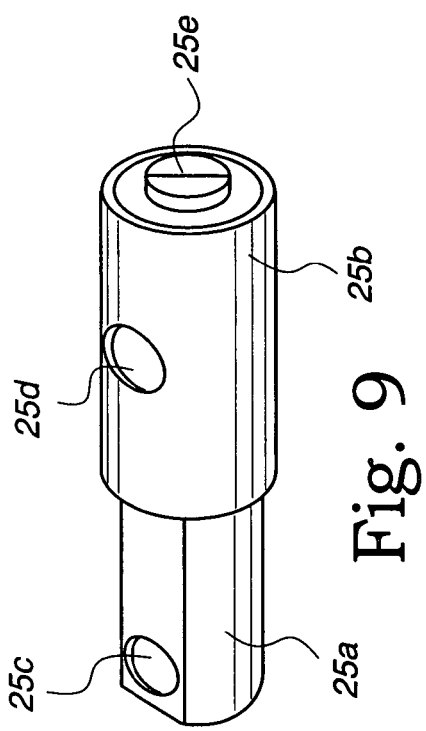
FIG. 9 is an isometric view of a yoke arm, in accordance with still another embodiment of the present invention.

FIG. 9 is an isometric view of the yoke arm 25, in accordance with one embodiment of the present invention. As shown, the yoke arm body 25b has a radius that is larger than a radius of the yoke arm base 25a. As shown, a radius of the protruded member 25e is smaller than the radius of the yoke arm body 25b. A top of the yoke arm body 25b is shown to include the aperture 25d. The aperture 25d is used to couple the yoke arm 25 with the linkage arm 24 using the spiral pin 62. Similarly, a top of the yoke arm base 25a is shown to be substantially flat having a bore 25c therein. The bore 25c is used to couple the yoke arm 25 to the yoke 26. The aperture 25d and the bore 25c are shown to be aligned linearly.

Figure 10A:
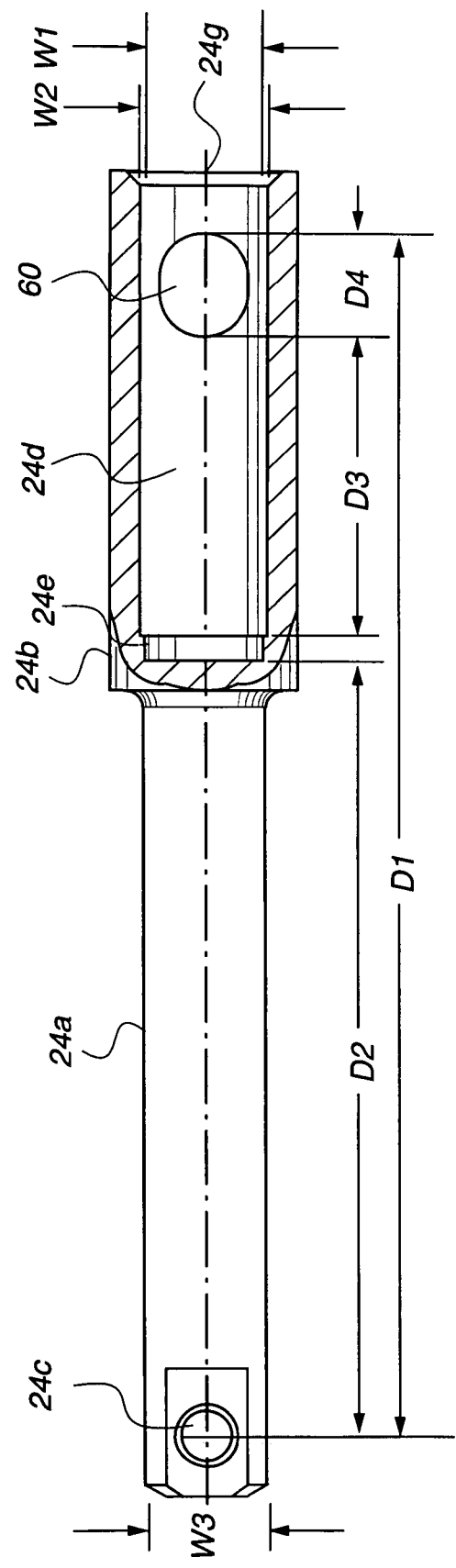
FIG. 10A is a top view of a linkage arm, in accordance with yet another embodiment of the present invention.
Figure 10B:
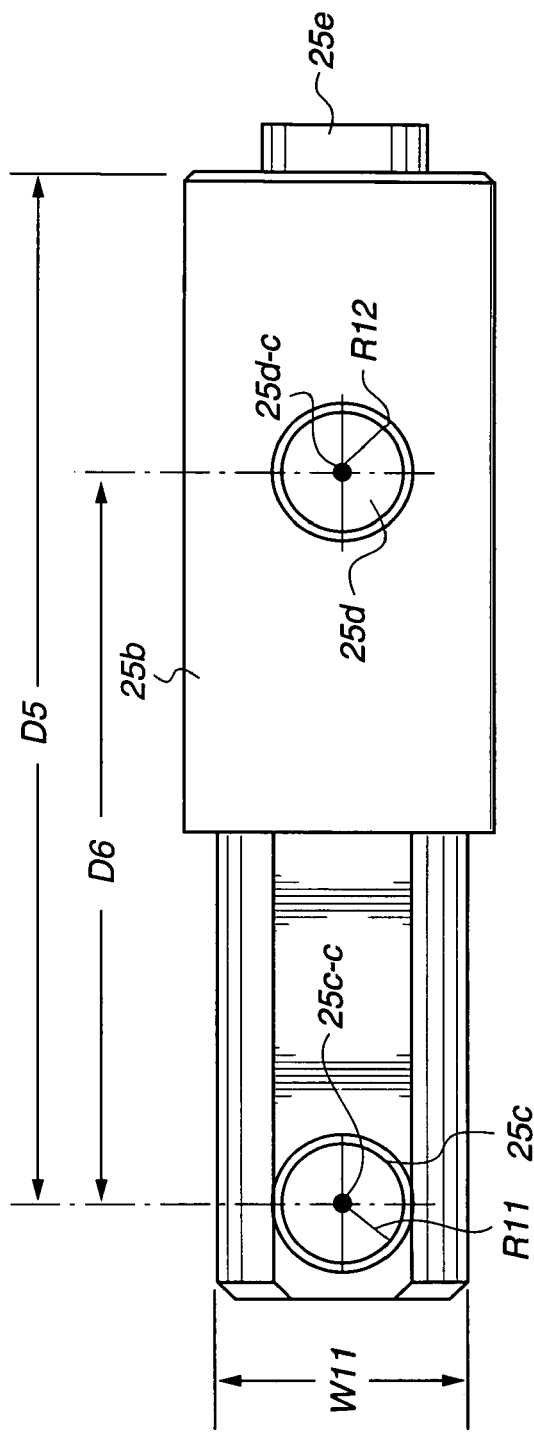
FIG. 10B is a top view of a yoke arm, in accordance with yet another embodiment of the present invention.

FIGS. 10A and 10B are top views of linkage arm 24 and yoke arm 25, respectively, in accordance with one embodiment of the present invention. As shown in FIG. 10A, the link arm 24b includes a hollow cylindrical chamber 24d that starts from a first end 24g of the linkage arm outer shell 24b and extends along a large section of the linkage arm outer shell 24b. As can be seen, a chamber extension 24e is defined within the linkage arm outer shell 24b adjacent to the chamber 24d. The opening 60 is shown to have an elliptical shape defined in close proximity to the side 24g of the linkage arm outer shell 24b. As can be seen, a center of the opening 60 and a center of the hole 24c defined in the linkage arm body 24a are linearly aligned.

As can be seen, in accordance with one aspect, a distance D1 defined between a center 24c-c of the hole 24c and the upper portion of the opening 60 is configured to be approximately 3.718 inches while a distance between the center 24c-c of the hole 24c and an inner sidewall of the chamber extension 24e is configured be approximately 2.823. Furthermore, a diameter D4 of the opening 60 is configured be approximately 0.198 inch and a distance between the lower portion of the opening 60 and the inner sidewall of the chamber 24d is configured to be approximately 0.215 inch. Furthermore, a width W3 of the linkage arm body 24a is approximately 0.310 inch, the width W2 of the chamber 24d ranges between approximately 0.3141 and 0.3164 inch, and the width W1 of the linkage arm body is approximately 0.293 inch. Of course, one of ordinary skill in the art must appreciate that the dimensions provided herein are merely exemplary. Accordingly, the dimensions may be scaled up or down, as necessary, depending on the application.

FIG. 10B is a top view of the yoke arm 25, in accordance with one embodiment of the present invention. As shown, a center 25d-c of the aperture 25d and a center 25c-c of the bore 25c are linearly aligned. As can be seen, a distance D5 between the center 25d-c of the aperture 25d and the center of the bore 25c-c of the bore 25c is approximately 0.775 inch. Additionally, a distance D5 between the center 25c-c and the sidewall of the yoke arm that is in contact with the protruded member 25e is approximately 1.087 inch. A radius R12 of the aperture 25d is approximately 0.125 inch while a radius R11 of the bore 25c ranges between approximately 0.1232 and 0.1228 inch, and is preferably approximately 0.1230 inch. As illustrated, a width W11 of the yoke arm base 25a is approximately 0.25 inch.

Figure 10C:
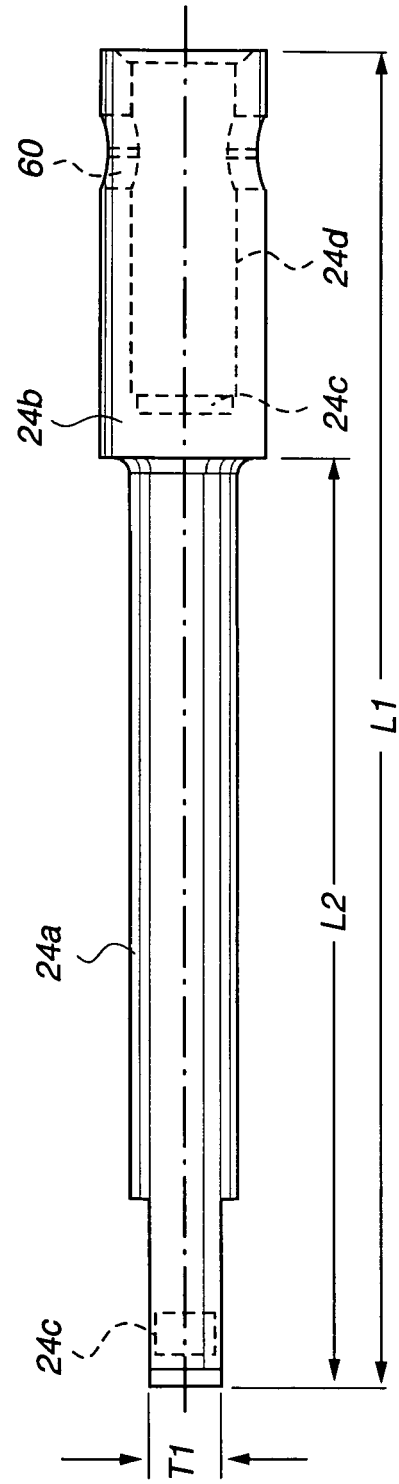
FIG. 10C is a side view of a linkage arm, in accordance with yet another embodiment of the present invention.
Figure 10D:
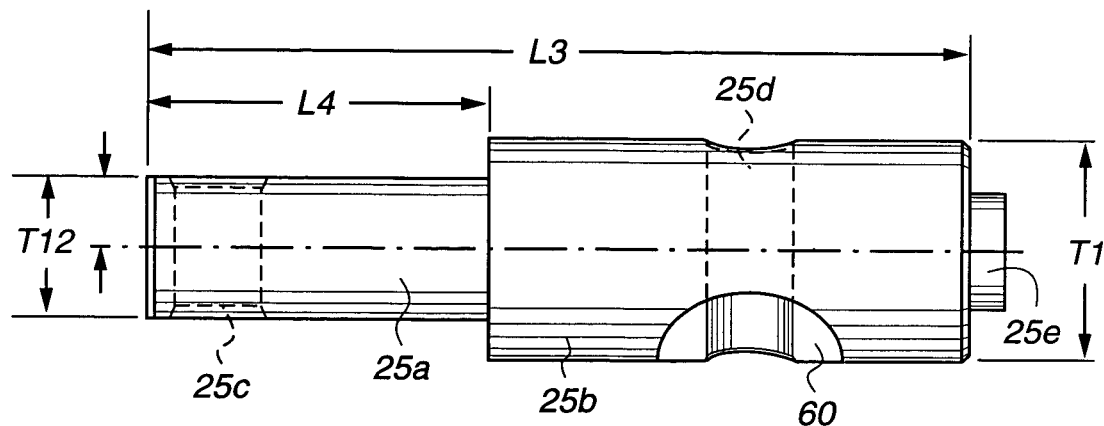
FIG. 10D is a side view of a yoke arm, in accordance with yet another embodiment of the present invention.

Side views of the linkage arm 24 and the yoke arm 25 are shown in FIGS. 10C and 10D, respectively, in accordance with one embodiment of the present invention. As can be seen, the hole 24c vertically extends through linkage arm body 24a. In a like manner, the bore 25c is shown to extend vertically through the yoke arm base 25a while the aperture 25d is shown to vertically extend through the yoke arm body 25b. As can be seen, the diameter of the extension member 24e is less than a diameter of the chamber 24d. In a like manner, the diameter of the chamber 24d is less than the diameter of the linkage arm body 24a, which in turn is less than the radius of the linkage arm outer shell 24b. In this manner, the spring 58 can be captured by the extension member 24e and the protruded member 25e.

In the embodiment shown in FIG. 10C, a length L1 of the linkage arm 24 is approximately 4.06 inches while a length L2 of the linkage arm body 24a is approximately 2.86 inches. A length of the yoke arm 25 is approximately 1.19 inches while a thickness of the yoke arm base 25a is approximately 0.50 inch.

A thickness T1 of the linkage arm body 25b is shown to be approximately 0.200 inch. The thickness of the yoke arm base 25a, also is approximately 0.20 inch while a thickness T11 of the yoke arm body 25b ranges between approximately 0.3135 and 0.3126 inch.

Figure 10E:
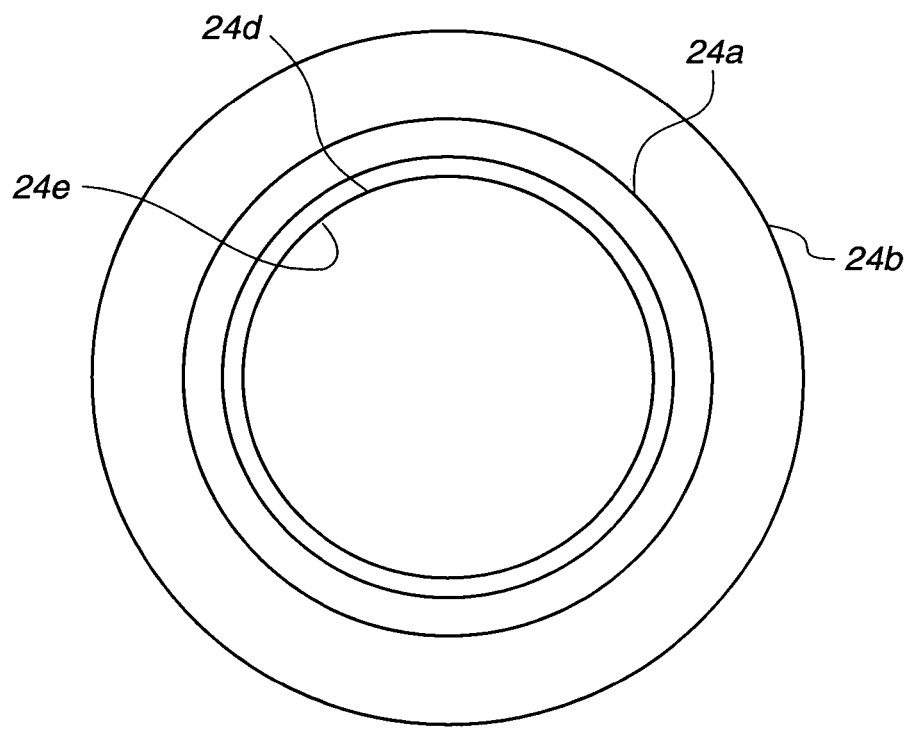
FIG. 10E is a side view of an arm assembly, in accordance with yet another embodiment of the present invention.

FIG. 10E is a side view of an exemplary arm assembly 23, in accordance with one embodiment of the present invention. As can be seen, in the embodiment shown in FIG. 10E, a diameter of the chamber extension 24e is smaller than a diameter of the chamber 24d. In turn, the diameter of the chamber 24d is smaller than a diameter of the linkage arm body 24a that is smaller than linkage arm outer shell 24b.

In one embodiment, the speed of rotation of the wafer is configured to range between approximately 0.00 and 3000 RPMs, and a more preferred range of approximately 0.00 and 2000 RPMs, and most preferably approximately 3000 RPMs during the spin, rinse, and dry operation. Additionally, the compression of the spring is configured to range between approximately 0.00 and 0.090 inch, and a more preferred range of approximately 0.00 and 0.050 inch, and most preferably approximately 0.050 inch for a wafer having 300 mm size during the spin, rinse, and dry operation.

Figure 11:
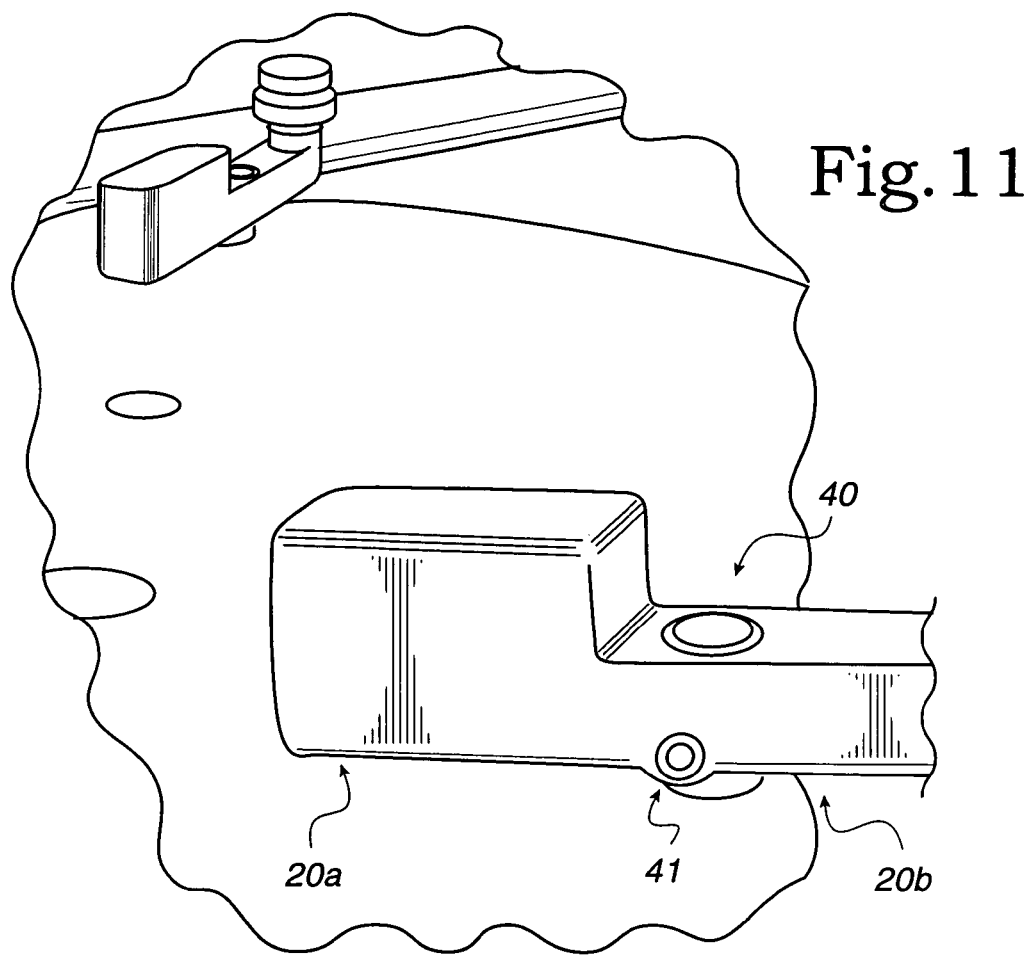
FIG. 11 is a picture of a portion of a gripper arm, in accordance with yet another embodiment of the present invention.

FIG. 11 depicts a partial gripper arm 20, in accordance with one embodiment of the present invention. As can be seen, the gripper arm 20 is shown to be a solid L-shaped arm. The gripper arm 20 has a gripper member 20a and a flat member 20b. The pin 40 is shown to couple the gripper arm 20 to the chuck top surface. In accordance with one embodiment of the present invention, the gripper arm 20 moves from an open position to a closed position about the pin 40.

As can be appreciated, in the gripper arm 20 of the present invention, a weight of the gripper arm 20 is designed such that the weight of the gripper member 20a is greater than the weight of the flat member 20b. In this manner, the gripper arm 20 of the present invention balances at the center point when the grippers are mounted on the flat members 20b of the arm assembly (e.g., the pin 40) during rotation at high RPMs. Thus, in one embodiment, the gripper arms 20 are balanced so that the gripper arms 20 may not open up while the chuck is spinning. In this manner, the grippers can maintain a grasp on the wafer being processed at higher speeds.

Additionally, in one embodiment, the gripper arm 20 can be configured to be longer than the prior art gripper arms so as to stop the gripper arms from moving during the spinning process. In one example, a moment between the gripper member 20a and the flat member 20b along the pin 40 is balanced about the center of the pin 40 (e.g., center of rotation).

Figure 12:
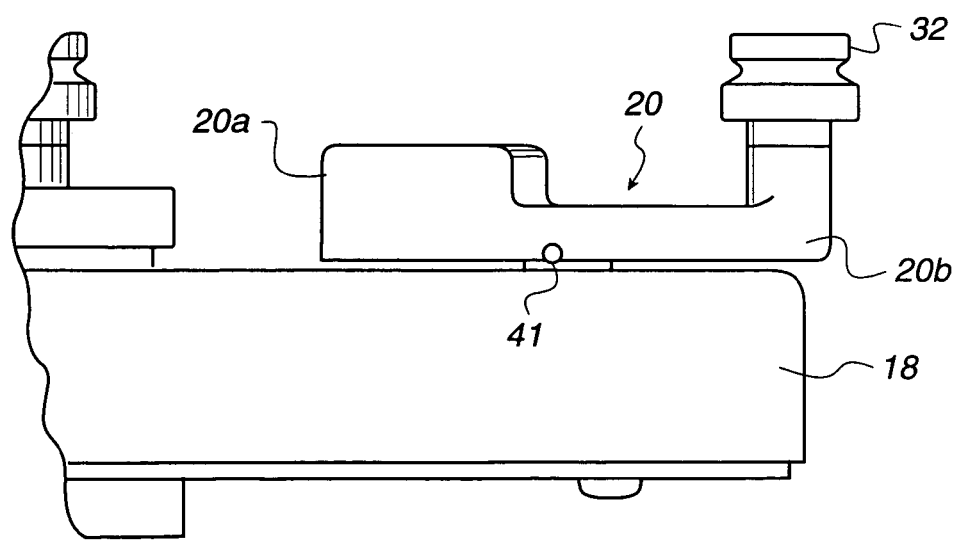
FIG. 12 is a side view of a gripper arm as coupled to the chuck topside using a gripper arm, in accordance with still another embodiment of the present invention.

The structure of an exemplary gripper arm 20 and gripper 32 can further be understood with respect to the side view shown in FIG. 12, in accordance with one embodiment of the present invention. As can be seen, the weight of the flat member 20b together with the gripper 32 mounted thereon is substantially equivalent to the weight of the gripper member 20a. As a consequence, the gripper arm 20 may no longer bounce (i.e., opens up) when the chuck and arm assembly 23 rotate at high speed (e.g., 3000 RPMs). Specifically, the moment between the gripper member 20a and the flat member 20b having a respective gripper 32 mounted thereon is balanced along the gripper pin 40.

Figure 13:
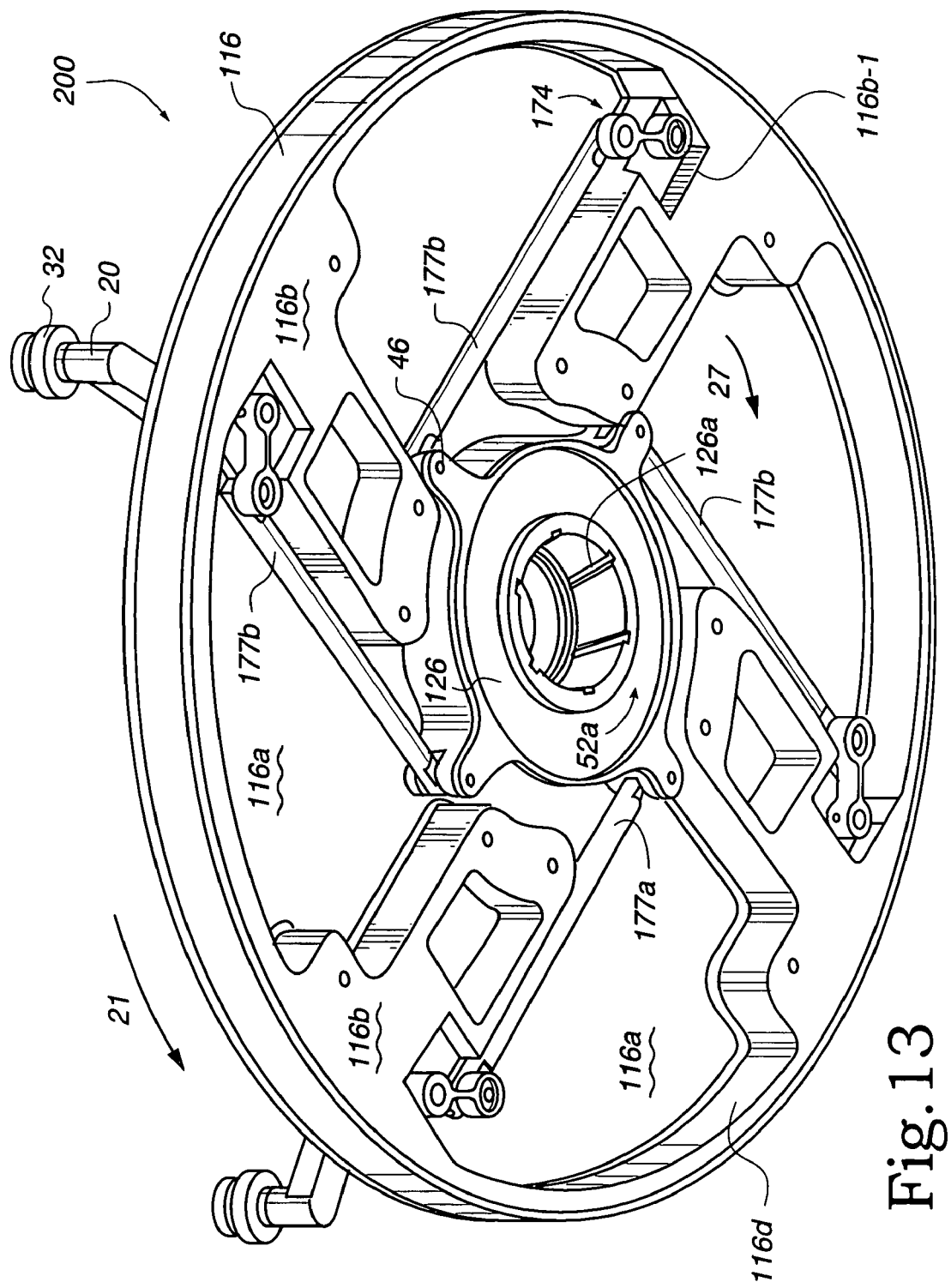
FIG. 13 an isometric bottom view of a chuck assembly defined in the open position, in accordance with yet another embodiment of the present invention.

Shifting to FIG. 13, an isometric bottom view of a chuck assembly 200 defined in the open position is depicted, in accordance with another embodiment of the present invention. As illustrated, the chuck assembly 200 includes a chuck body 116 and a plurality of chuck links 177. Each chuck link 177 is coupled to a respective linkage spring 174, on a first end, and to the yoke 126, on a second side. In the embodiment illustrated in FIG. 13, the chuck assembly 200 includes four chuck links 177, four linkage springs 174, and four gripper arms 20.

A plurality of carved sections 116a are defined within the bottom surface of the chuck body 116 creating a plurality of ribs 116b. Each rib 116b has a respective half-square-shaped carved portion 116b-1 allowing each of the respective chuck links 177 to be coupled to the corresponding carved portion 116b-1 using the associated linkage spring 174. One of the benefits of defining the carved sections 116a in the chuck body 116 is that the operation of the chuck assembly 200 requires less energy due to the reduction in the weight of the chuck body. In one embodiment, machining of the chuck body 116 can also be simplified as less number of stages can be used.

As can be seen, on the second side, each of the chuck links 177 is coupled to the yoke 126 using a respective spindle linkage pin 46 and, on the first end, each chuck link 177 is coupled to the respective linkage spring 174. Thus, the rotational movement of the yoke 126 causes the chuck links 177 and thus the linkage springs 174 to move, which in turn, causes the gripper arms 20 to move, engaging the wafer. As will be explained in more detail below, one of the chuck links 177, stopper chuck link 177a, is longer than the remaining chuck links 177b. The stopper chuck link 177a is configured to move until a tip of the stopper chuck link 177a comes into contact with the inner sidewall 116d of the chuck body 116. Thus, in one preferred embodiment, the stopper chuck link 177a is used as a hard stop. In this manner, initially, the force exerted on the wafer being processed is consistently controlled by the stopper chuck link 177a, as the rotation of the yoke 126 and thus the movement of the chuck links 177 halts once the stopper chuck link 177a contacts the chuck inner sidewall 116d. As in this embodiment the stopper chuck link 177a is not shown to be in contact with the inner sidewall 116d of the chuck body 116, the illustrated chuck assembly 200 is in the open position.

Figure 14A:
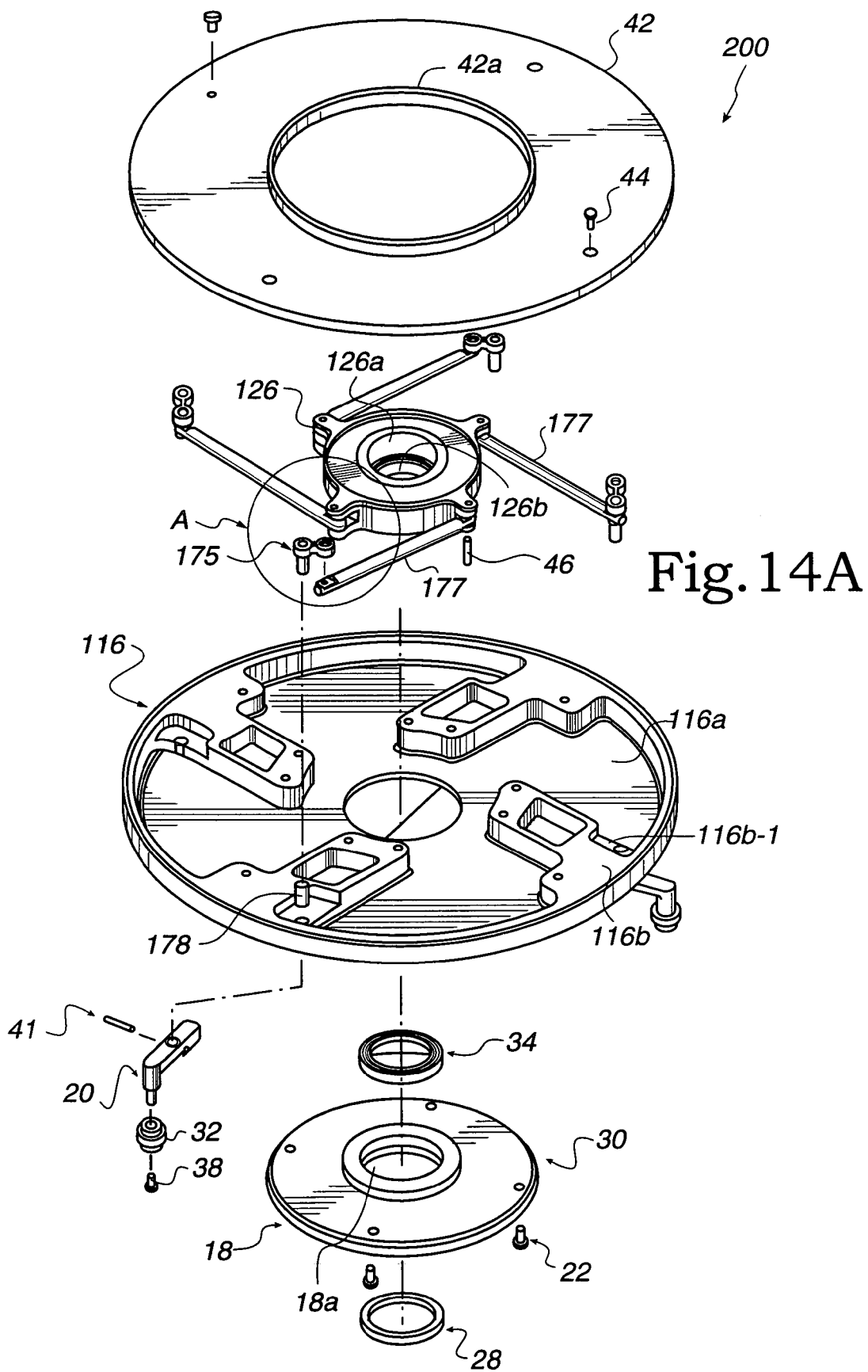
FIG. 14A an isometric, exploded, top view of a fully assembled chuck assembly, in accordance with still another embodiment of the present invention.

Moving to FIG. 14A, an isometric, exploded, top view of a fully assembled chuck assembly 200 is illustrated, in accordance with one embodiment of the present invention. The chuck assembly 200 includes the chuck backside cover 42, the yoke 126, as coupled to the plurality of chuck links 177, the chuck body 116, and the chuck cover 18. The chuck backside cover 42 includes a concentric backside cover orifice 42a and is coupled to the chuck body 116 using a plurality of button caps 44. Analogously, a plurality of screws 22 is implemented to attach the chuck cover 18 having a passage 18a therein to the chuck body 116. A backside plate bearing 34 is defined within the inner surface of passage 18a between the chuck cover 18 and the chuck body 116 while a chuck assembly seal 28 is defined on an outer surface of the passage 18a. Before attaching the chuck cover 18 to the chuck body 116, an O-ring 30 is securely defined on the inner edge of the chuck cover 18 so as to prevent any type of leakage into and out of the chuck body 116.

A plurality of carved portions 116a is shown to separate a plurality of respective ribs 116b defined in the chuck body 116. The chuck body 116 is further shown to include a central bore 116c. As can be seen, the central bore 116c, the yoke central aperture 126c, and the passage 18a in the chuck cover 18, and the orifice 42a in the chuck backside cover are vertically aligned. In this manner, once the chuck assembly 200 is fully assembled, the lead screw 106 can be fed into the fully assembled chuck assembly 200 through the central bore 116c, the yoke central aperture 126b, the passage 18a, and the orifice 42a.

Four chuck links 177 (i.e., stopper chuck link 177a and chuck links 117b) are coupled to the yoke 126 using respective spindle linkage pins 46, on the second side. On the first end, each chuck link 177 is coupled to a respective spring assembly 175. As will be explained in more detail below, each spring assembly 175 is coupled to the respective gripper arm 20 using a chuck bushing 178 and the associated gripper pin 41. As illustrated, each of the plurality of grippers 32 is mounted on the respective gripper arm 20 mounted on the outer surface of the chuck bottom wall. Thus, the gripper arms 20 are coupled to the respective spring assembly 175 by associated gripper pins 41 through the bottom wall of the chuck body 116.

In the embodiment of FIG. 14A, four grippers 32, four gripper arms 20, four chuck links 177, four gripper pins 41, and four spring assemblies 175 are implemented. The grippers 32 are defined around the outer surface of the chuck body 116 within substantially equal distance from each other, thus applying equal force using the transferred equal and identical exerted compression force. Of course, in a different embodiment, any appropriate number of grippers, gripper arms, arm assemblies, chuck links, and spring assemblies can be implemented so long as the number of the components corresponds so that equal force can be applied to the process wafer.

In accordance with one embodiment, the rotation of the yoke 126 applies force to the chuck links 177b and stopper chuck link 177a, thus causing the first end of each chuck link 177 to move closer to the chuck inner sidewall 116d. In turn, in one example, the grippers 32 start moving so as to engage the wafer 3. Once the wafer is engaged, the upper portion of the lead screw 6a continues to move downwardly within the yoke central aperture 126b for a distance causing the stopper chuck link 177a and chuck links 177b to move until the tip 177a-e of the stopper chuck link 177a comes into contact with the chuck inner sidewall 116d. Next, the upper portion of the lead screw 106b moves downwardly for another short distance within the yoke central aperture 126c until the upper portion 106b of the lead screw is defined at the lowest position the upper portion 126b of the yoke 126 can assume. The additional movement of the yoke 126 applies pressure onto the stopper chuck link 177a and remaining chuck links 177b. However, due to the stopper chuck link 177a being in contact with the chuck inner sidewall 116d, neither the stopper chuck link 177a nor the remaining chuck links 177b can move. As a result, the pressure applied by the movement of the yoke 126 is transferred by the chuck links 177 to the respective spring linkage 174 causing the spring linkages 174 to deflect to a repeatable dimension. In one example, the stopper chuck link 177a contacting with the inner sidewall 116d of the chuck body 116, limits the deflection of the spring. The deflection of the spring linkages 174 in turn applies compression force to the corresponding grippers 32 causing the grippers 32 to engaged the wafer using the compression force. As a consequence, additional consistent and equal pressure is applied onto the edge of the wafer by the grippers 32. In this manner, the wafer 3 is engaged using the additional consistent and constant compression force typically not implemented in conventional chuck assemblies thus preventing the wafer from possibly losing contact with the edge of the wafer 3 during the spin, rinse, and dry operation.

Figure 14B:
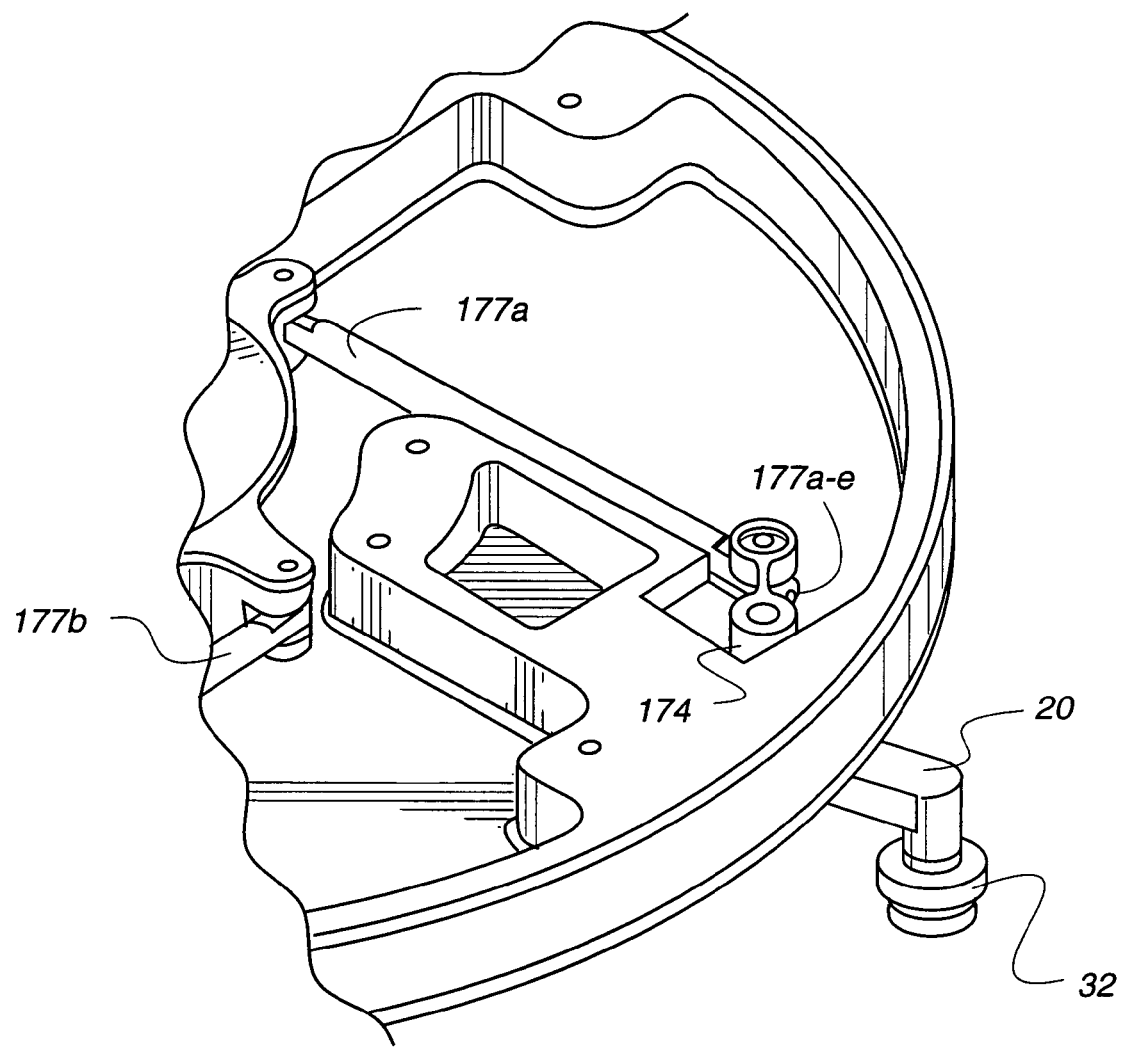
FIG. 14B a partial, enlarged, and isometric bottom view of the chuck assembly, in accordance with yet another embodiment of the present invention.

Proceeding to FIG. 14B, a partial, enlarged, and isometric bottom view of the chuck assembly 200 is shown, in accordance with one embodiment of the present invention. As can be seen, the stopper chuck link 177a has the tip 177a-e, which as illustrated, slightly extends below the respective linkage spring 174 in the horizontal plane. In this manner, the tip 177a-e stops additional movement of the stopper chuck link 177a.

Figure 14C:
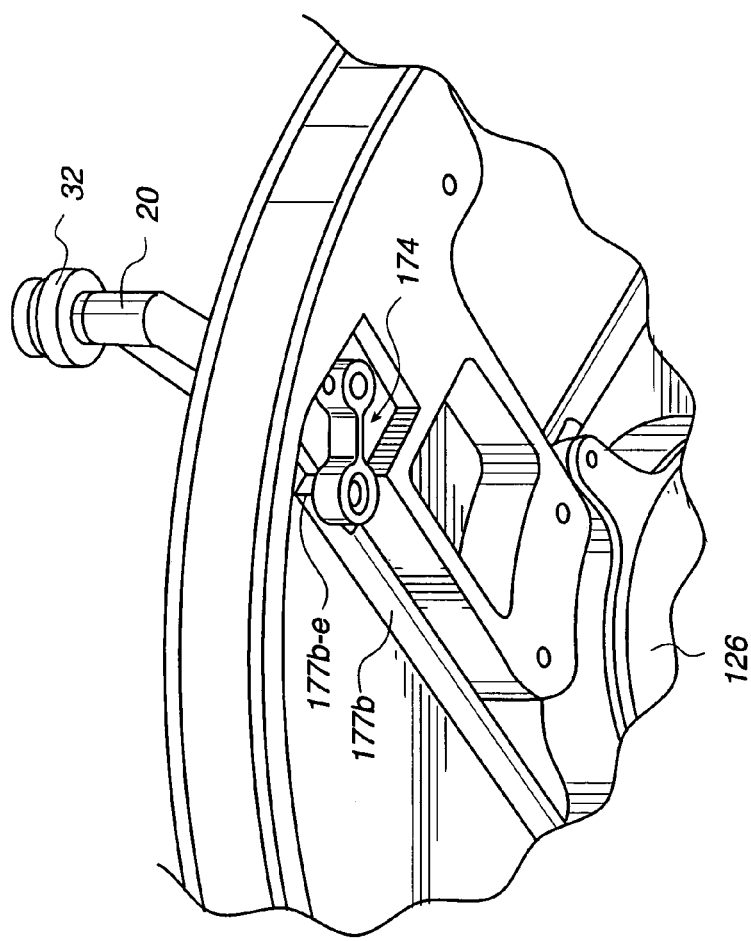
FIG. 14C a partial, enlarged, and isometric bottom view of the chuck assembly, in accordance with still another embodiment of the present invention.

Comparatively, the partial enlarged isometric bottom view of FIG. 14C shows the remaining chuck link 177b having a tip 177b-e that does not extend below the respective linkage springs 174, in accordance with one embodiment of the present invention. Thus, while the tip 177a-e of the stopper chuck link 177a comes into contact with the inner surface of the chuck inner sidewall 116d, the tip 177b-e of the remaining chuck links 177b do not contact the chuck inner sidewall 116d. Additional information with respect to the structure and mechanism of the linkage spring is provided below.

Figure 14D:
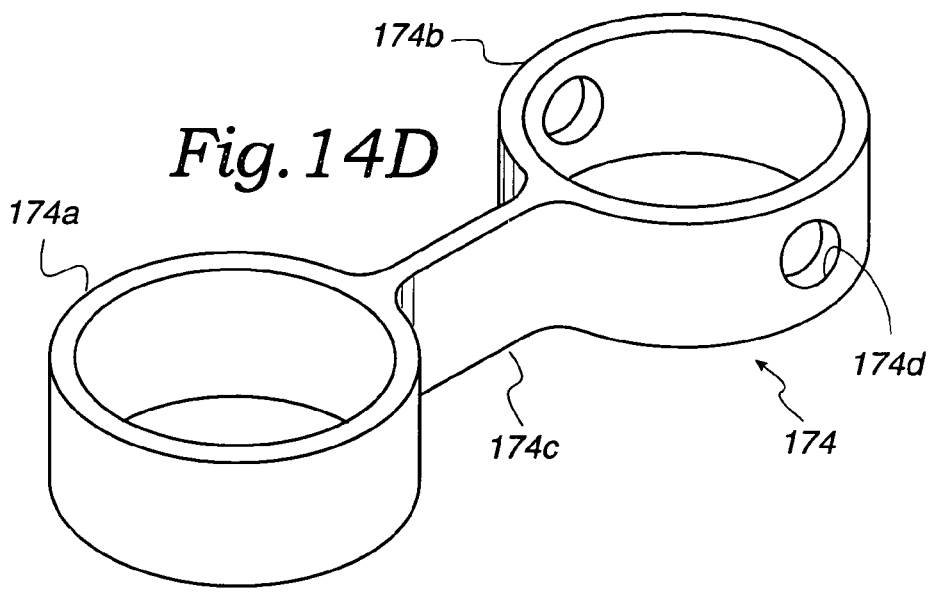
FIG. 14D a simplified enlarged isometric view of a linkage spring, in accordance with yet another embodiment of the present invention.

FIG. 14D depicts a simplified enlarged isometric view of a linkage spring 174, in accordance with one embodiment of the present invention. As can be seen, the linkage spring 174 includes a cylindrical spring link element 174a and a cylindrical spring actuating element 174b separated by a rectangular connecting beam 174c. The spring link element 174a and spring actuating element 174b are defined on the opposite extremities of the connecting beam 174c. Additional information with respect to the structure and mechanism of the spring assembly 175 is provided below. In the embodiment shown in FIG. 14D, the linkage spring 174 is configured to be fabricated from 17-7PH heat-treated stainless steel. However, in a different embodiment, the linkage spring 174 can be fabricated from any material capable of deflecting (i.e., having spring-like properties) (e.g., stainless steel, nickel based alloys, high carbon spring steels, etc.) It must be noted that in one preferred embodiment, the material configured to be implemented to construct the spring is also configured to have a substantially long fatigue life under high stress and is configured to be resistant to chemicals/fluids used within the SRD module.

Figure 14E:
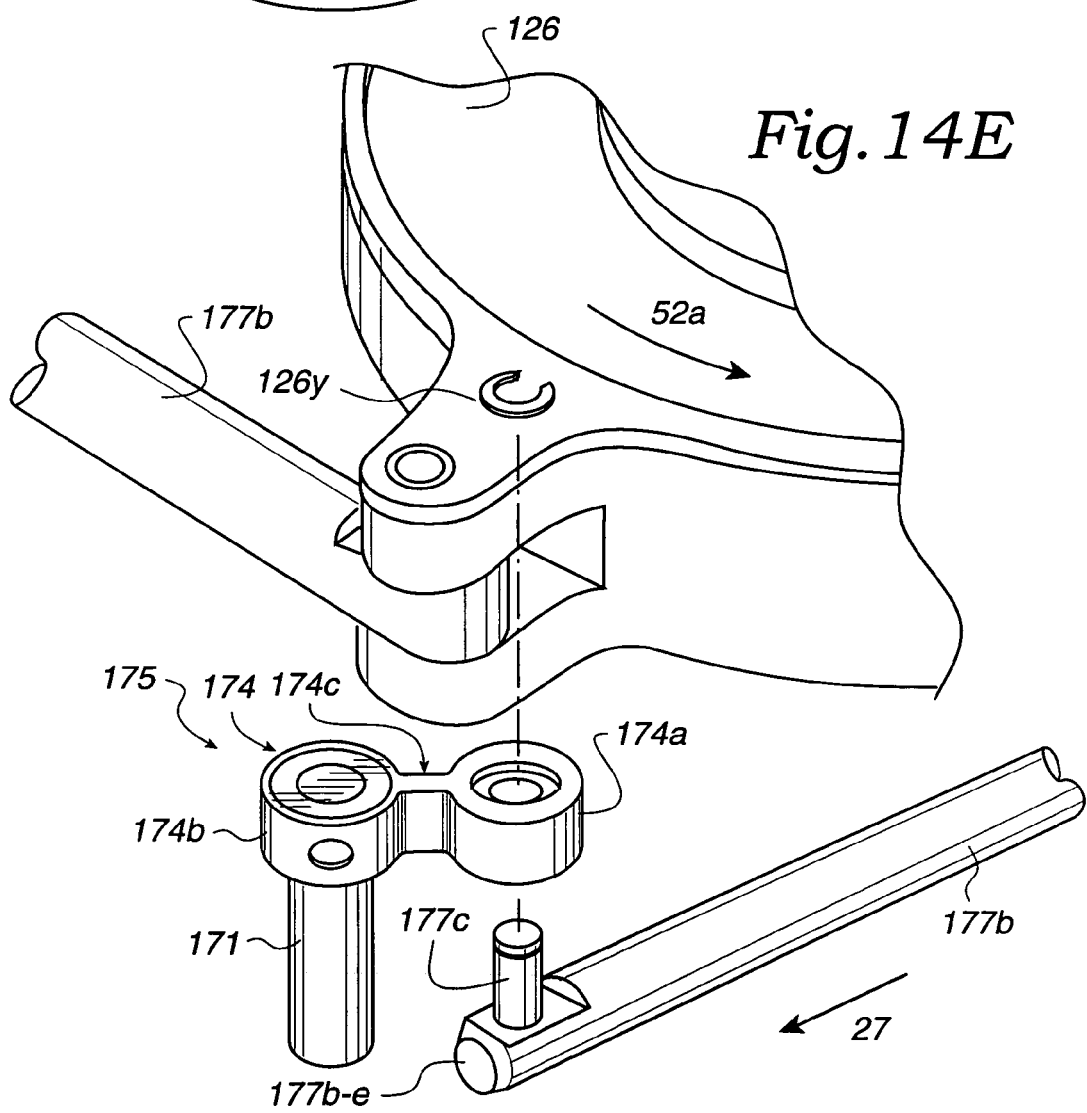
FIG. 14E is a partial, enlarged, isometric view of a spring assembly, in accordance with still another embodiment of the present invention.

Securing a spring assembly 175 to the yoke 126 and a chuck link 177b is shown in the partial enlarged isometric view shown in FIG. 14E, in accordance with one embodiment of the present invention. On the first side, the spring assembly 175 is secured to the yoke 126 by a yoke retaining ring extension E-ring 126y and to a chuck link pin 177c of the chuck link 177b on the second side. A respective chuck link pin 177c is defined on each of the stopper chuck link 177a and chuck links 177b substantially close to the respective tips 177a-e and 177b-e. Thus, in one embodiment of the present invention, the chuck links 177b and thus the spring assemblies 175 are secured to the yoke 126 by inserting the chuck link pin 177c through a spring link element of each spring assembly 175 and hooking the chuck link pin 177c to the yoke retaining ring extension E-ring 126y.

In this manner, the movement of the yoke 126 in the yoke movement direction 26d causes the chuck links 177b to move in the chuck movement direction 27, which ultimately leads to the movement of the gripper arms 20.

FIG. 14F is an exploded isometric view of the spring assembly 175, in accordance with one embodiment of the present invention. As can be seen, the spring assembly 175 includes an actuating arm 171 configured to be coupled to the spring actuating element 174 using a cylindrical linkage bushing 172 and a pin roll 173. In one embodiment, the actuating arm 171 includes holes 171a and 171b symmetrically defined on the first extremity of the actuating arm 171. A hole 171a is aligned vertically with the hole 171b' and is defined on the opposite extremity of the actuating arm 171. The linkage bushing 172 is nested inside a concentric opening in the spring actuating element 174b. As can be seen, the spring actuating element 174b includes two symmetrically defined holes 174b1 and 174b2. In a like manner, the linkage bushing 172 includes symmetrically defined holes 172a and 172b. As nested inside the spring actuating element 174b, the holes 172a and 172b are respectively aligned with holes 174b2 and 174b1. Similar to the linkage bushing 172, the hole 171a of the actuating arm 171 is designed to be aligned with the holes 172a and 174b2 of the spring actuating element 174b.

By way of example, the actuating arm 171 is inserted into a concentric orifice defined in the linkage bushing 172 nested inside the spring actuating element 174b. The actuating arm 171 is secured to the spring assembly by inserting the pin roll 173 through the holes 174b1, 172b, and 171b and holes 171a, 172a, and 174b2, respectively.

The spring link element 174a is designed to be secured to the chuck linkage 177 using a cylindrical linkage bushing 179 and a cylindrical chuck linkage bushing 176. The chuck linkage bushing 176 includes a concentric aperture 176a and the linkage bushing 179 includes a concentric bore 179a. In one embodiment, the chuck linkage bushing 176a is snapped into the bore 179a of the linkage bushing 179. Thereafter, the chuck linkage bushing 176 and thus the linkage bushing 179 are pressed inside the concentric opening defined in the spring link element 174a. In this manner, the movement of the spring actuating element 174b results in the movement of the spring link element 174a.

Figures 1, 15A:
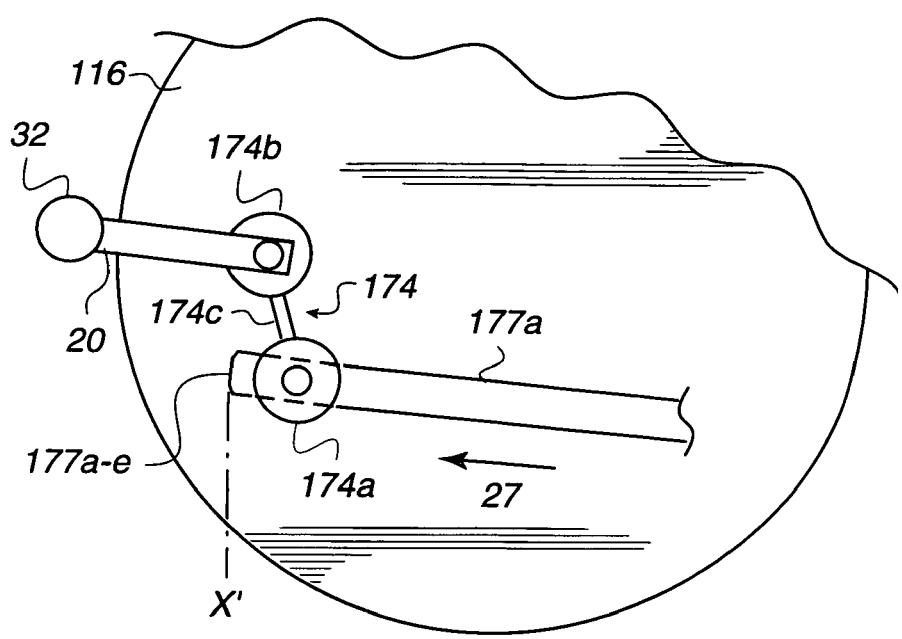
Figures 2, 15A:
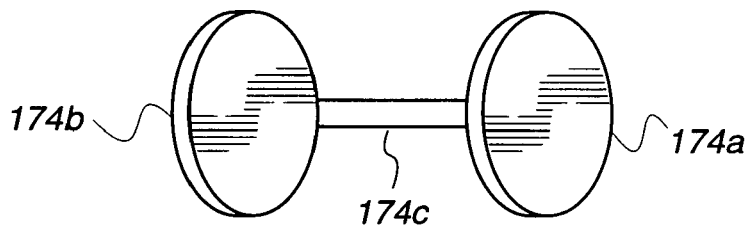
Figures 3, 15A:
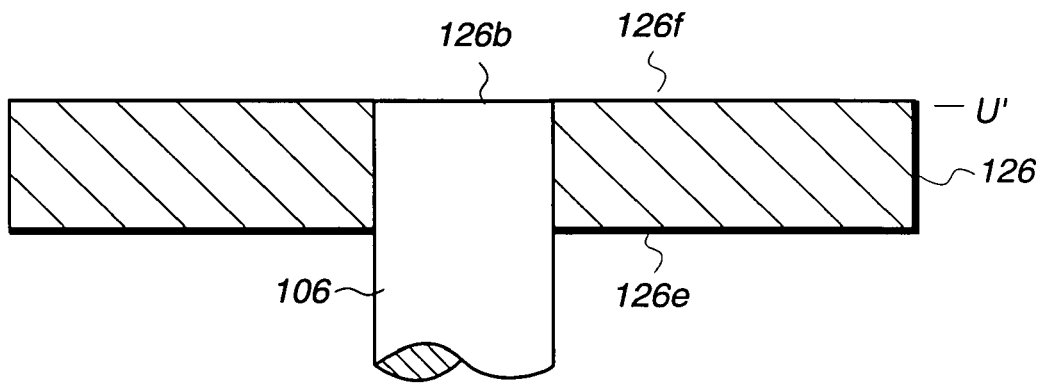

Shifting to FIGS. 15A-1 through 15C-3, transferring the downward movement of the lead screw 106 to the rotational movement of the gripper arms 20 is illustrated, in accordance with one embodiment of the present invention. Starting with FIGS. 15A-1, the alignment of the stopper chuck link 177a, linkage spring 174, and the grippers 32 is shown when the chuck is in the open position. As can be seen, the tip 177a-e of the stopper chuck link 177a is defined at a position X' defining a gap between the tip 177a-e of the stopper chuck link 177a and the inner sidewall 116d of the chuck body 116. As shown in FIGS. 15A-2, the spring connecting member 174 is in a substantially flat position, as the stopper chuck link 177a is not yet in contact with the chuck inner sidewall 116d and that compression force is not yet being applied on the spring link element 174a. In this embodiment, the linkage spring 174 is in the relaxed position and the gripper 32 is not contacting or engaging the wafer. As shown in FIGS. 15A-3, the upper portion 106b of the lead screw 106 is defined at substantially the same level as the yoke upper surface 126f, at Height U'.

Figures 1, 15B:
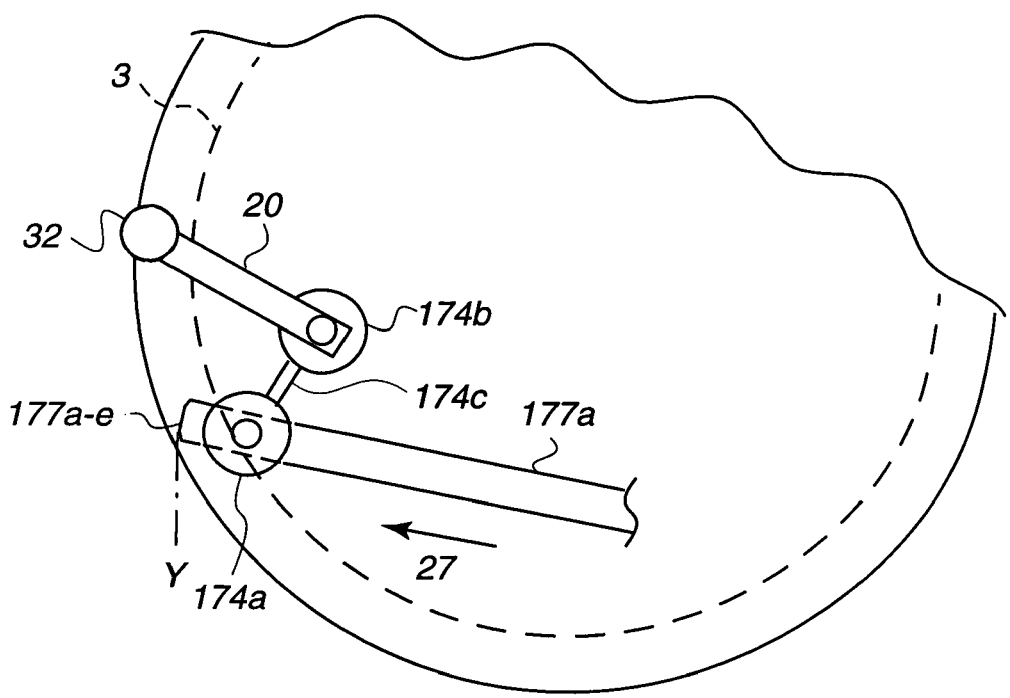
Figures 2, 15B:
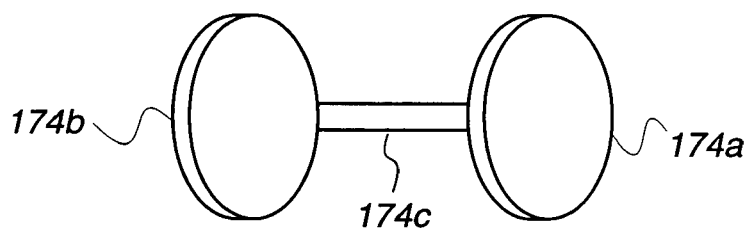
Figures 3, 15B:
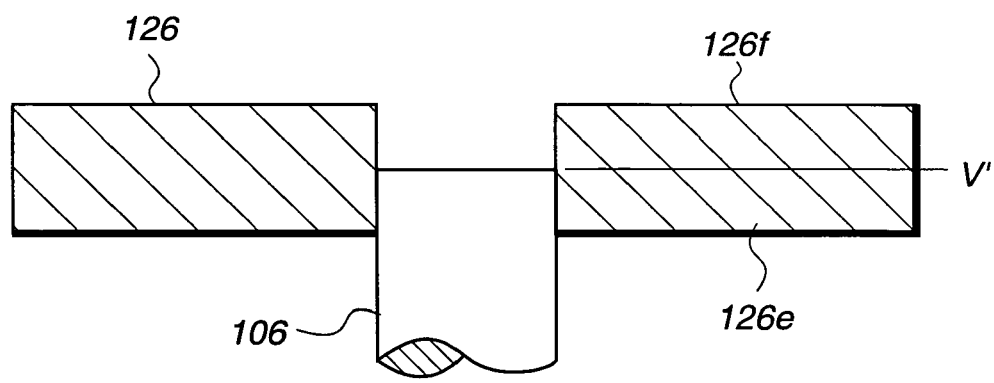

Moving to FIGS. 15B-1 through 15b-3, positions of the stopper chuck link 177a, the linkage spring 174, the gripper arm 20, and the gripper 32 when engaging the wafer are shown, in accordance with one embodiment of the present invention. In this embodiment, the tip 177a-e of the stopper chuck link 177a is in contact with the chuck inner sidewall 116d and is defined at a position Y'. As can be seen, the gap initially exiting between the tip 177a-e of the stopper chuck link 177a and the inner sidewall 116d of the chuck body 116 wall no longer exists. The gripper arm 20 and thus the gripper 32 have moved and the gripper 32 engages the wafer 3 using the force. As shown in FIG. 15B-2, the linkage spring 174 is still in the relaxed position as the connecting beam 174c is still substantially flat. Furthermore, as illustrated in FIGS. 15B-3, the upper portion 106b of the lead screw 106 has moved downwardly within the yoke aperture 126c of the yoke 126. The downward movement of the upper portion 106b of the lead screw 106 is illustrated by a Height V' defined by the upper portion 106b of the lead screw 106 with a lower surface 126e of the yoke 126. As can be seen, the upper portion 106b of the lead screw 106 has not yet reached the lowest position the lead screw upper portion 106b can assume within the yoke 126.

In one embodiment, the movement of the lead screw 106 causes the yoke 126 to rotate which in turn initiates the movement of the stopper chuck link 177a toward the inner sidewall 116d of the chuck body 116 triggering the movement of the gripper arms 20 and the grippers 32. Of course, although at this point the grippers engage the wafer 3, the wafer is being engaged using some force, the wafer can fly off during the wafer preparation in the SRD module.

Figures 1, 15C:
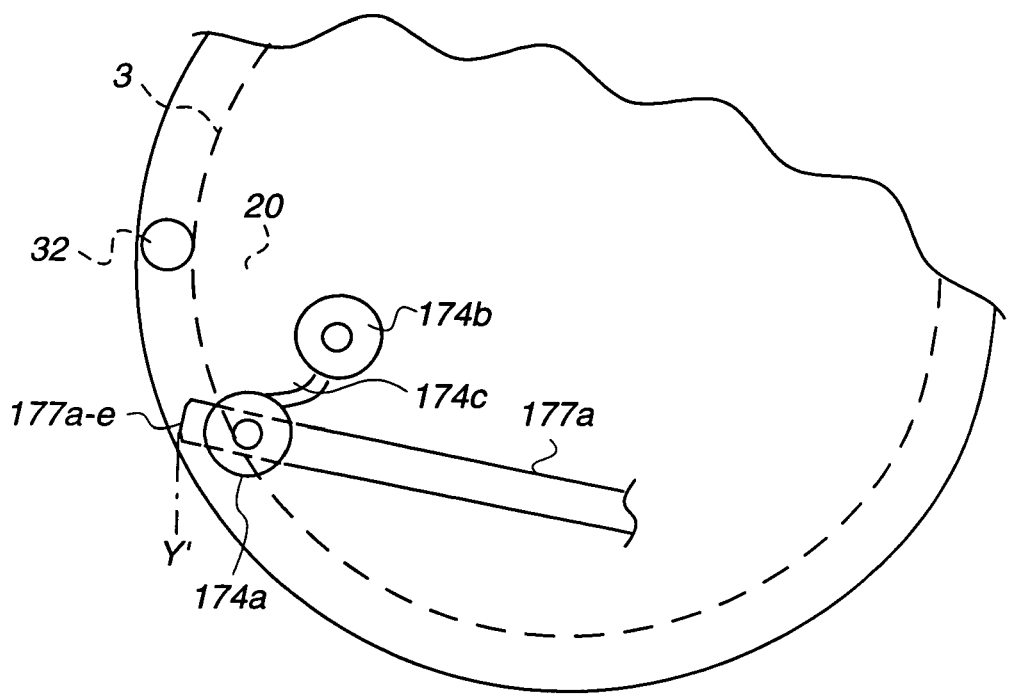
Figures 2, 15C:
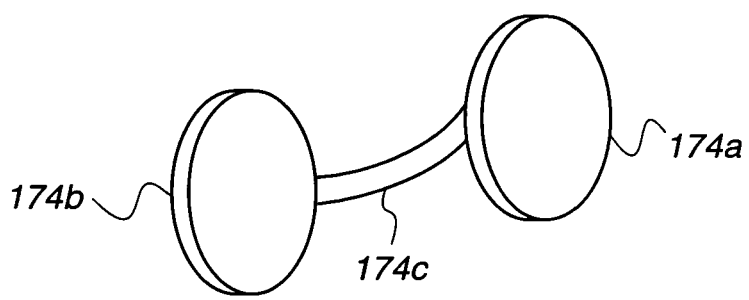
Figures 3, 15C:
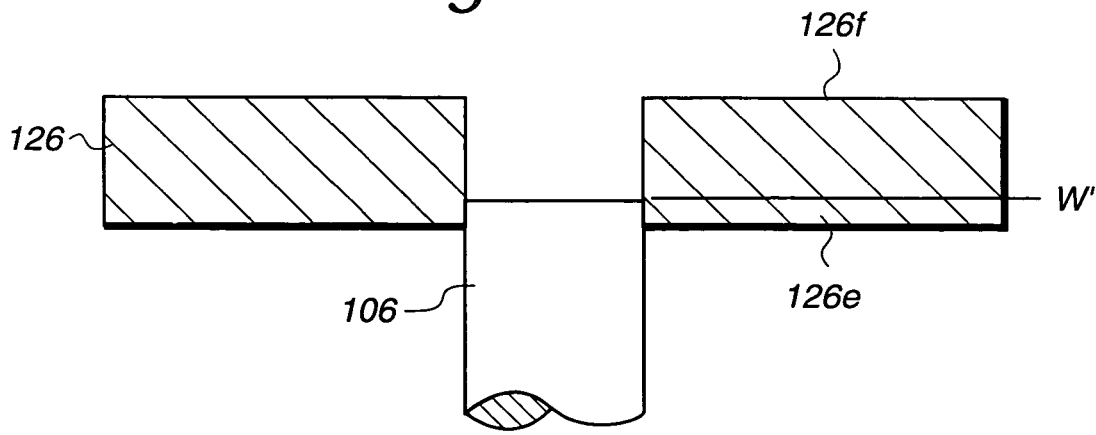

Proceeding to FIGS. 15C-1 through 15C-3, the positions of the stopper chuck link 177a, the linkage spring 174, the gripper arm 20, and the gripper 32 are illustrated when the chuck 116 is in the closed position, in accordance with one embodiment. In this implementation, the gripper 32 engages the wafer 3 using additional consistent compression force so as to prevent the wafer 3 from possibly flying off during the SRD operation. As can be seen, the tip 177a-e of stopper chuck link 177a is still defined in position Y'. However, as illustrated, the connecting beam 174c is deflected and is no longer in the flat position, as shown in FIGS. 15C-2. As further illustrated in FIGS. 15C-3, the upper portion 106b of the lead screw 106 is defined at the lowest position the upper portion 106b can assume within the yoke 126. Thus, as can be seen, the upper portion 106b is defined at a height W'.

That is, the lead screw 106 and the chuck links 177 can no longer move, as the tip 177a-e of the stopper chuck link 177a is in contact with the inner sidewall 116d of the chuck body 116. Furthermore, the arm grippers 20 and grippers 32 cannot move any farther once the grippers 32 contact the wafer 3. The lead screw 106 continues to rotate until the stopper chuck link 177a contacts the inner sidewall of the chuck body. As a consequence, the pressure resulting from the most recent downward movement of the lead screw 106 results in applying an extra force onto the spring actuating element 174b. The extra force results in the deflection of the spring. Since the deflection distance of the spring 174 is controlled by the stopper chuck link 177a, a consistent compression force is supplied to the edge of the wafer 3.

According to one implementation, the gripper arm 20 as well as the gripper 32 applies force onto the edge of a wafer having a smaller diameter. By way of example, if the wafer is removed while the chuck is still in the closed position and the linkage springs are in a relaxed position, the grippers 32 and the gripper arms 20 would be able to engage a wafer having a smaller diameter than the process wafer. In one example, the grippers 32 engage the process wafer having an actual diameter of about 11.81 inches. In such an example, as a result applying the compression force, when the chuck is in the closed position, the grippers 32 could have been engaging a wafer having a less diameter, for example, about 11.73 inches. In one embodiment, the pressure applied by each of the grippers 32 is configured to range between approximately 4 lbs and 16 lbs, and a more preferred range of approximately 6 lbs and 12 lbs, and most preferably approximately 8 lbs during the spin, rinse, and dry operation. As a result of the compression force, the wafer edge is securely engaged by the grippers thus preventing the wafer from potentially flying off during the spin, rinse, and dry operations.

According to one embodiment, securely engaging the wafer with the compression force can be explained as follows. After the process wafer is inserted into the SRD bowl, the linear movement of the spindle assembly as controlled by the pneumatic control causes the lead screw 106 to move downwardly within the yoke 126. As a result, the lead screw male threads engage with female threads defined in the inner surface 126b of the yoke 126. Specifically, the linear movement of the lead screw is translated to rotational movement of the yoke 126 as the female threads and the male threads engage.

The stopper chuck link 177a is pushed forward by the rotational movement of the yoke 126 thus causing the spring actuating element 174a to move closer to the inner sidewall 116d of the chuck body, reducing the existing gap. At this point, the gripper 32, already in contact with the wafer, starts moving so as to engage the wafer. Once the tip 177a-e of the stopper chuck link 177a contacts the inner sidewall of the chuck body 116, the wafer is engaged using force while the lead screw still has a slight distance to travel within the yoke aperture 126c. Once the lead screw travels the remaining distance, the yoke applies more pressure onto the stopper chuck link 177a. However, as the tip of the stopper chuck link 177a-e is already in contact with the chuck inner sidewall, the spring actuating element 174b can no longer be moved, thus transferring the pressure to the connecting beam 174c, deflecting the connecting beam 174c to a repeatable dimension. At this juncture, the gripper 32 engages the wafer using the compression force thus preventing possible flying off of the wafer during SRD operation. Of course, in one preferred embodiment, the compression force generated from the compression of the springs is consistently applied to the edge of the wafer.

FIG. 16A is an enlarged top view of the linkage spring 174, in accordance with one embodiment of the present invention. As can be seen, each of the spring actuating elements 174b and link springs 174a includes an inner circle having a radius R21 and an outer circle having a radius R21. In one example, the radius R22 is configured to be approximately 0.440 inch while the radius R21 is configured to range between approximately 0.380 inch and 0.382 inch. According to one embodiment, the distance D27 between a center c2 of the spring actuating element 174b and a center c1 of the spring link element 174a is approximately 0.780 inch. In a like manner, in one aspect, a width W21 of the connecting beam 174c is configured to range between approximately 0.299 and 0.301 inch.

FIG. 16B is an enlarged side view of the linkage spindle 174, in accordance with one embodiment of the present invention. As can be seen, in one instance, a radius R23 of the hole 174d defined in the spring actuating element is approximately 0.93 inch while a thickness T21 of the linkage spring 174 is approximately 0.188 inch.

However, one of ordinary skill in the art must appreciate that the dimensions provided herein are merely exemplary and should not be implemented to limit the scope of the application.

In one embodiment, the speed of rotation of the wafer is configured to range between approximately 0.00 and 3000 RPMs, and a more preferred range of approximately 500 and 1800 RPMs, and most preferably approximately 3000 RPMs during the spin, rinse, and dry operation. Additionally, the deflection of the connecting beam is configured to range between approximately 0.02 inch and 0.06 inch and, and a more preferred range of approximately 0.035 inch and 0.045 inch and, and most preferably approximately 0.040 inch for a wafer spinning at approximately 1800 RPM during the spin, rinse, and dry operation.

In accordance with one embodiment of the present invention, the process wafers can be loaded to the chuck assembly of SRD module using a robot. The process wafers are transferred from an input cassette defined in a load station to an output cassette. In one example, the robot implements the end effector to extract a process wafer from the input cassette. Then, the robot is extended to the level of the SRD module. The end effector is inserted into the SRD module through the sidewall of process chamber of the SRD module. At this point, the end effector can deliver the process wafer to the SRD wafer retainers (e.g., grippers). Next, the end effector extracts the process wafer from the SRD module once processing of the process wafer has concluded. The end effector delivers the clean process wafer to an output station.

In accordance with one embodiment, the end effecter unloads the clean process wafer to an output cassette positioned on a base defined on an output shelf. The output cassette is capable of holding a number of cleaned process wafers. In another embodiment, a standard mechanical interface (SMIF) pod may be used instead of the output cassette.

Although in the embodiments discussed an end effector has been implemented to load/unload the process wafer to/from the SRD module, it must be appreciated by one of ordinary skill in the art that any appropriate mechanism may be used so long as the function of loading and unloading of the process wafer is achieved.

Figure 17:
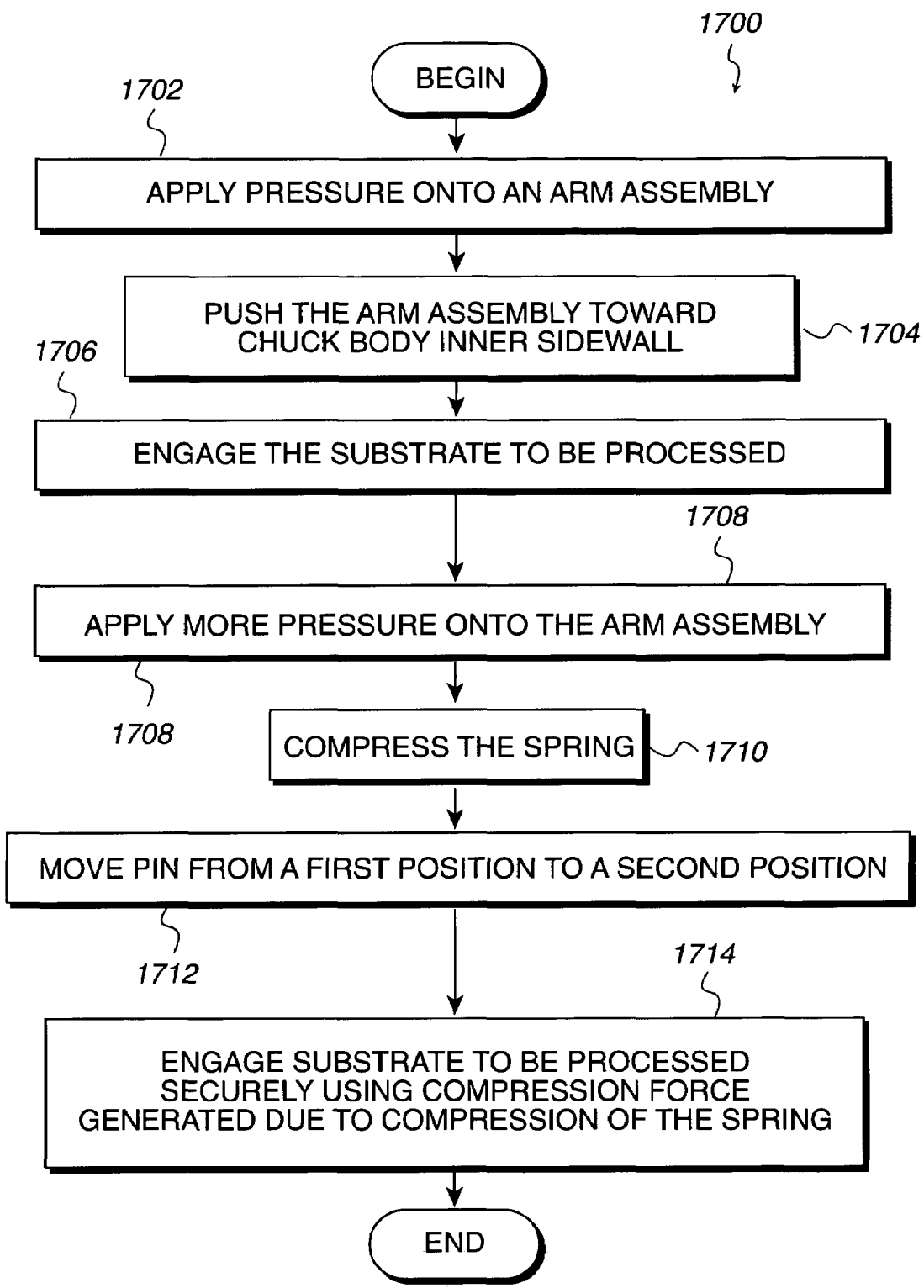
FIG. 17 is a flowchart diagram depicting method operations performed in securely engaging a substrate to be processed using an arm assembly including a spring, in accordance with still another embodiment of the present invention.

FIG. 17 is a flowchart diagram 1700 of method operations performed in securely engaging a substrate to be processed using an arm assembly including a spring, in accordance with one embodiment of the present invention. The method begins in operation 1702 in which pressure is applied onto an arm assembly by translating the downward movement of the lead screw to a rotational movement of the yoke. Next, in operation 1704 the arm assembly is pushed toward the chuck inner sidewall. The movement of the arm assembly also causes the gripper arm and thus the gripper contacting the process substrate to move. The method then continues to operation 1706 in which the substrate to be processed is engaged by the grippers. Also included in the method is applying an additional pressure onto the arm assembly followed by compressing of the spring in operation 1710. Then, in operation 1712 the pin is moved in the opening form a first position to a second position limiting the compression of the spring. Thereafter, the process substrate is engaged securely using compression force generated by the compression of the spring.

Figure 18:
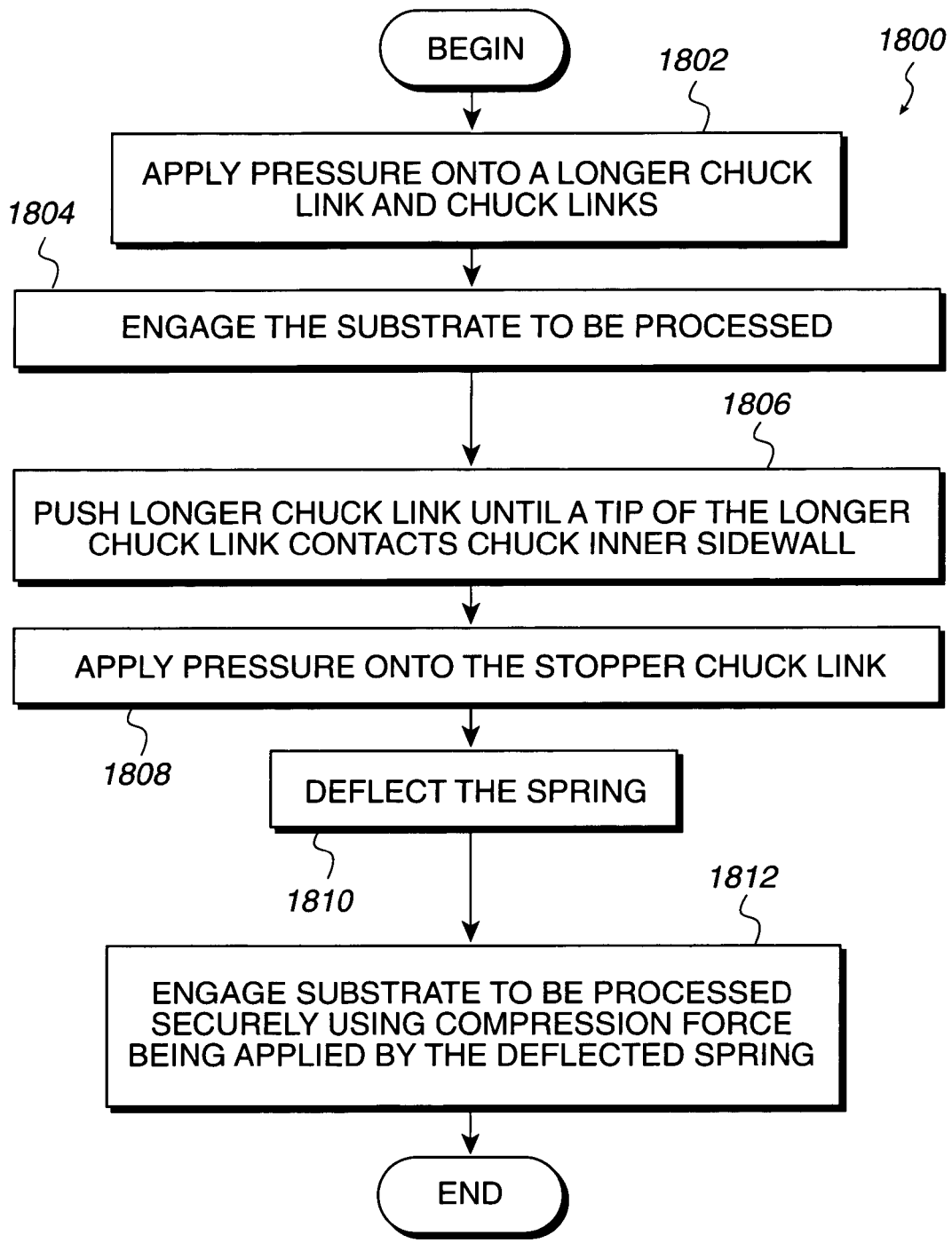
FIG. 18 depicts a flowchart diagram of method operations performed in securely engaging a substrate to be processed using a stopper chuck link and a spring, in accordance with yet another embodiment of the present invention.

Proceeding to FIG. 18, a flowchart 1800 of method operations performed in securely engaging a substrate to be processed using a stopper chuck link and a spring, in accordance with one embodiment of the present invention. The method begins in operation 1802 in which pressure is applied onto the stopper chuck link and the remaining chuck links. In one embodiment, the chuck includes four links, three of which have equal lengths while one is longer (i.e., the stopper link chuck). In operation 1804, the substrate to be processed is engaged by the grippers followed by the operation 1806 in which the stopper chuck link is pushed toward the chuck inner sidewall until the tip of the stopper chuck link comes into contact with the chuck inner sidewall. Next, in operation 1808, pressure is applied to the stopper chuck link leading to operation 1810 in which the spring is deflected to a repeatable dimension. Thereafter, in operation 1812 the substrate to be processed is engaged securely using the compression force that is being applied by the deflected spring.

It must be noted that in one embodiment, the SRD module of the present invention can be part of a cluster tool that includes a plurality of modules wherein different wafer preparation operations are performed on the process wafer (e.g., brush box, etch chamber, etc.).

Although the foregoing invention has been described in some detail for purposes of clarity of understanding, it will be apparent that certain changes and modifications may be practiced within the scope of the appended claims. For example, embodiments described herein have been primarily directed toward spinning, rinsing, and dry (SRD) wafers; however, it should be understood that the SRD module of the present invention is well suited for spin rinsing of any type of substrate. Furthermore, it should be understood that the SRD module of the present invention is well suited for spin rinsing of any size wafer or substrate, such as hard disks, if desired. Furthermore, although the embodiments of the present invention have implemented a plurality of male and female threads on the lead screw and the chuck yoke, any mechanism capable of translating the upwardly/downwardly movement of the lead screw without rotating the lead screw can be implemented. Accordingly, the present embodiments are to be considered as illustrative and not restrictive, and the invention is not to be limited to the details given herein, but may be modified within the scope and equivalents of what is described herein.

The invention claimed is:

1. A chuck assembly for use in a spin, rinse, and dry (SRD) module, the chuck assembly comprising:
   a chuck yoke configured to rotate;
   a plurality of arm assemblies connected to the chuck yoke on a first end, each of the plurality of arm assemblies including a spring, an opening, and a pin, the opening having an open position and a closed position, the pin being defined in the open position in the opening, wherein an initial rotation of the chuck yoke applies a force onto the plurality of arm assemblies causing the plurality of arm assemblies to move and a secondary rotation of the chuck yoke causes each of the plurality of the springs to compress moving the pin from the open position to the closed position; and
   a plurality of gripper assemblies, a second end of each of the arm assemblies being connected to a respective one of the plurality of gripper assemblies, the chuck yoke being capable of rotating to move each of the plurality of arm assemblies and respective plurality of gripper assemblies into a closed position, wherein a compression force from each of the linkage springs is applied to a substrate when the gripper assemblies are moved to the closed position, wherein each arm assembly includes, a linkage arm including an outer shell, the outer shell including a chamber, the linkage arm further including a linkage arm opening defined along a portion of the outer shell;

a yoke arm having a yoke arm body, a front portion of the yoke arm body being defined within the chamber, the yoke arm body including a yoke arm opening, the yoke arm opening configured to be aligned with the linkage arm opening;

said spring disposed between the yoke arm and the linkage arm, the spring configured to be wrapped around the front portion of the yoke arm; and said pin disposed within the linkage arm opening and the yoke arm opening, the pin configured to move between the open position and the closed position so as to limit the compression of the spring.

2. A chuck assembly for use in a spin, rinse, and dry (SRD) module, the chuck assembly comprising:

a chuck yoke configured to rotate;

a plurality of chuck links each having a first end and a second end, each of the plurality of chuck links configured to be connected to the chuck yoke on the first end, a stopper chuck link of the plurality of chuck links being longer than the remaining chuck links of the plurality of chuck links;

a plurality of linkage springs connected to each of the plurality of chuck links on the second end; and a plurality of gripper assemblies, a second end of each of the chuck links being connected to a respective one of the plurality of gripper assemblies, the chuck yoke being capable of rotating to move each of the plurality of chuck links and respective plurality of gripper assemblies into a closed position, wherein a compression force from each of the linkage springs is applied to a substrate when the gripper assemblies are moved to the closed position.

3. A chuck assembly as recited in claim 2, wherein each of the gripper assemblies includes a substrate retainer and a gripper arm.

4. A chuck assembly as recited in claim 3, wherein the linkage spring includes, an actuating element having a cylindrical shape;

a spring link element having a cylindrical shape; and a connecting beam having a rectangular shape, the connecting beam connecting the actuating element with the spring link.

5. A chuck assembly as recited in claim 4, wherein the actuating element is connected to the gripper arm.

6. A chuck assembly as recited in claim 4, wherein the spring link element is connected to the chuck link.

7. A chuck assembly for use in a SRD module as recited in claim 1, wherein each of the plurality of gripper assemblies includes a gripper arm and a substrate retainer.

8. A chuck assembly as recited in claim 4, wherein connecting beam deflects after a tip of the stopper chuck link is in contact with an inner sidewall of a chuck body.

9. A chuck assembly as recited in claim 1, wherein the linkage arm includes a linkage arm body configured to be connected to a gripper arm.

10. A chuck assembly as recited in claim 1, wherein the yoke arm includes a yoke base configured to be connected to the chuck yoke.

11. A chuck assembly as recited in claim 1, wherein the plurality of arm assemblies is configured to move substantially simultaneously.

12. A chuck assembly as recited in claim 7, wherein the substrate is disengaged when the plurality of the gripper arms is tangentially perpendicular to a surface of the substrate and the pin is defined in the opening in the open position.

* * * * *